(12) United States Patent
Solak et al.

(10) Patent No.: US 9,036,133 B2
(45) Date of Patent: *May 19, 2015

(54) LITHOGRAPHIC FABRICATION OF GENERAL PERIODIC STRUCTURES BY EXPOSING A PHOTOSENSITIVE LAYER TO A RANGE OF LATERAL INTENSITY DISTRIBUTIONS

(75) Inventors: Harun H. Solak, Brugg (CH); Christian Dais, Turgi (CH); Francis Clube, Neuchatel (CH)

(73) Assignee: Eulitha AG, Villigen Aargau (CH)

( * ) Notice: Subject to any disclaimer, the term of this patent is extended or adjusted under 35 U.S.C. 154(b) by 831 days.

This patent is subject to a terminal disclaimer.

(21) Appl. No.: 13/218,657

(22) Filed: Aug. 26, 2011

(65) Prior Publication Data

US 2011/0310374 A1 Dec. 22, 2011

Related U.S. Application Data

(63) Continuation-in-part of application No. 12/706,081, filed on Feb. 16, 2010, now Pat. No. 8,368,871.

(51) Int. Cl.
*G03B 27/32* (2006.01)
*G03B 27/54* (2006.01)
(Continued)

(52) U.S. Cl.
CPC ............... *G03B 27/58* (2013.01); *G03B 27/54* (2013.01); *G03F 7/201* (2013.01); *G03F 7/70325* (2013.01); *G03F 7/7035* (2013.01); *G03F 7/70408* (2013.01)

(58) Field of Classification Search
CPC ... G03F 7/201; G03F 7/70325; G03F 7/7035; G03F 7/70408
USPC ................................ 355/67, 77; 430/322, 325
See application file for complete search history.

(56) References Cited

U.S. PATENT DOCUMENTS 4,360,586 A 11/1982 Flanders et al.
2006/0286488 A1 12/2006 Rogers et al.
(Continued)

FOREIGN PATENT DOCUMENTS

EP 1810085 A2 7/2007
WO 2006045439 A2 5/2006

OTHER PUBLICATIONS

Zanke et al., "Large-area patterning for photonic crystals via coherent diffraction lithography", J. Vac. Sci. Technol. B 22(6), Nov./Dec. 2004, pp. 3352-3355.
(Continued)

*Primary Examiner* — Peter B Kim
*Assistant Examiner* — Michelle Iacoletti
(74) *Attorney, Agent, or Firm* — Laurence A. Greenberg; Werner H. Stemer; Ralph E. Locher

(57) ABSTRACT

A lithographic method related to Talbot imaging for printing a desired pattern of features that is periodic or quasi-periodic in at least one direction onto a substrate surface, which method includes providing a mask bearing a pattern of mask features, arranging the substrate parallel and in proximity to the mask, providing an illumination source having a central wavelength and a spectral bandwidth, forming from said source an illumination beam with an angular distribution of intensity, arranging the distance of the substrate from the mask and exposing the mask pattern to said beam so that each angular component of illumination exposes the substrate to substantially the entire range of lateral intensity distributions that occur between successive Talbot image planes for the illumination wavelengths, wherein the angular distribution of the beam is designed in conjunction with the pattern of features in the mask and the distance of the substrate from the mask.

13 Claims, 18 Drawing Sheets

(51) Int. Cl.
  *G03B 27/58* (2006.01)
  *G03F 7/20* (2006.01)

(56) References Cited

U.S. PATENT DOCUMENTS

2008/0186579 A1  8/2008  Solak
2011/0199598 A1  8/2011  Solak et al.
2011/0310374 A1  12/2011 Solak et al.
2012/0092634 A1  4/2012  Solak et al.
2012/0092635 A1  4/2012  Solak et al.

OTHER PUBLICATIONS

Solak et al., "Achromatic spatial frequency multiplication: A method for production of nanometer-scale periodic structures", J. Vac. Sci. Technol. B 23(6), Nov./Dec. 2005, pp. 2705-2710.

Tennant et al., "Characterization of near-field holography grating masks for optoelectronics fabricated by electron beam lithograph", J. Vac. Sci. Technol. B 10(6), Nov./Dec. 1992, pp. 2530-2535.

LITHOGRAPHIC FABRICATION OF GENERAL PERIODIC STRUCTURES BY EXPOSING A PHOTOSENSITIVE LAYER TO A RANGE OF LATERAL INTENSITY DISTRIBUTIONS

CROSS-REFERENCE TO RELATED APPLICATIONS

This application is a Continuation-in-part of Ser. No. 12/706,801, filed 16th Feb. 2010 by the present inventors, which is incorporated herein by reference.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION BY REFERENCE OF MATERIAL SUBMITTED ON A COMPACT DISC

Not Applicable

BACKGROUND TO THE INVENTION

1. Field of the Invention

This invention generally relates to the field of photolithography as employed for the fabrication of micro- and nano-structures, and it relates more particularly to the field of Talbot imaging as employed for transferring periodic patterns of features defined in a mask onto a photosensitive layer on a substrate.

2. Description of Related Art

Lithographic fabrication enables the creation of micro- and nano-patterns on surfaces. Photolithographic techniques involve exposure of a photosensitive surface to a light-field with a certain pattern of intensity distribution. The surface usually consists of a thin layer of sensitive film, such as a photoresist, coated onto a substrate surface. Chemical or physical changes that occur in the photoresist may be used in subsequent processes to obtain desired patterns of materials on the substrate surface. In the most commonly used photolithographic technique the pattern is defined in a mask and the pattern is transferred to the substrate by illuminating the mask and imaging the light transmitted by the pattern onto the substrate surface using an optical system.

For many applications patterns are required that comprise a unit cell of pattern features that repeat in one or two dimensions, that is, periodic patterns. A specialized photolithographic technique based on the Talbot effect is advantageous for transferring such periodic patterns from masks onto substrates because it avoids the use of an imaging system which, for high resolution patterns, is complex and high-cost. With this technique a mask defining a periodic pattern is illuminated with collimated beam of monochromatic light and the light diffracted by the pattern reconstructs images of the periodic pattern at certain distances, called Talbot planes, from the mask (see, for example, C. Zanke, et al., "Large area patterning for photonic crystals via coherent diffraction lithography", J. Vac. Sci. Technol. B 22, 3352 (2004)). In the case of a one-dimensional periodic patterns, in which a unit cell of features repeats in one direction, the separation, s, between successive Talbot planes is related to the illumination wavelength, $\lambda$, and period of the pattern, p, by $$s \approx kp^2/\lambda \qquad \text{equ. (1)}$$

where k is a constant whose value depends on the array-type of the periodic pattern.

For a one-dimensional periodic pattern, i.e. a linear grating, k=2, whereas for two-dimensional periodic patterns, the value of k depends on the array symmetry. For a hexagonal close packed pattern of features, k=1.5 if p refers to the nearest-neighbour distance.

The Talbot effect, which is also called self-imaging, may be used to print periodic patterns onto substrates. Midway between the Talbot planes there are other images with the same period that are phase shifted by half the period with respect to those in the Talbot planes. Furthermore, between these phase-shifted images and the self-images there are so-called Talbot sub-images that have smaller periods, i.e. higher spatial frequencies. By placing a photoresist coated substrate at one of these fractional Talbot planes, periodic patterns can be printed with a spatial frequency that is a multiple of that in the original mask. This variant, which enables spatial-frequency multiplication, performs better when the duty cycle of the periodic pattern in the mask is optimized to yield a high-contrast intensity distribution in the fractional Talbot planes (see U.S. Pat. No. 4,360,586). In the prior art, it is also known that by fabricating the periodic patterns in the mask out of phase shifting materials the contrast of the Talbot images can be enhanced. With the Talbot technique, however, the intensity distribution of the imaged pattern is very sensitive to the distance from the mask. Therefore, precise positioning and alignment of the substrate to be patterned with respect to the mask is of critical importance. This "depth of field" (DoF) consideration becomes much more restrictive as the period of the pattern in the mask is reduced because the DoF depends on the square of the pattern period. This limitation is especially severe if the periodic patterns need to be printed onto substrates that have imperfect flatness or have topographical features on their surface.

In another, related method known in the prior art as "near field holography", a mask with a periodic pattern is illuminated obliquely by a collimated beam of monochromatic light (see, for example, D. M. Tennant, et al., "Characterization of near-field holography grating masks for opto-electronics fabricated by electron beam lithography, J. Vac. Sci. Technol. B 10, 2530 (1992)). The angle of incidence of the illuminating beam is chosen in relation to the period of the pattern and to the wavelength of the light so that only the zeroth-order (i.e. undiffracted) beam and a first-order diffracted beam are present in the transmitted light-field. An image of the periodic pattern is formed by the interference of these two transmitted beams. A major drawback of this method is that the pattern transferred to the substrate necessarily has the same period as the pattern in the mask, in other words there can be no gain in resolution with respect to the mask. Furthermore, only one-dimensional, line/space periodic patterns can be transferred with this method, which is a considerable disadvantage. Additionally, in order that the imaged pattern has a good contrast this method requires the use of expensive phase masks that are usually formed by etching the patterns into fused silica substrates. Moreover, this method requires obliquely incident light which results in a rather cumbersome system configuration, and requires polarized light which can further complicate the illumination system and reduce the utilization efficiency of the light source.

Achromatic Talbot lithography has recently been introduced as a new method for printing high-resolution periodic patterns in a cost effective way (see H. H. Solak, et al., "Achromatic Spatial Frequency Multiplication: A Method for Production of Nanometer-Scale Periodic Structures", J. Vac. Sci. Technol., 23, 2705 (2005) and European Patent Application No. 05803386.1). It offers two significant advantages for lithographic applications: firstly, it overcomes the depth-of-field problem encountered in the classical Talbot method described above, and secondly, for many pattern types the printed patterns have a higher spatial-frequency than that in the mask, that is, it can perform a spatial-frequency multiplication. Achromatic Talbot lithography (ATL) illuminates the mask with a collimated beam from a broadband source and the substrate to be patterned is placed at or beyond a certain distance from the mask at which the image generated becomes stationary, that is, invariant to further increase in distance. The minimum distance, $d_{min}$, required for the stationary image to be formed is related to the period of the pattern, p, in the mask and to the spectral bandwidth of the illumination, $\Delta\lambda$, by:

$$d_{min} \approx kp^2/\Delta\lambda \qquad \text{equ. (2)}$$

where k is a constant whose value depends, as for equ. (1), on the array-type of the periodic pattern.

At this distance the Talbot planes for the different wavelengths are distributed in a continuous manner, and so placing the substrate at or beyond this distance exposes the substrate to the entire range of lateral intensity distributions that occur between successive Talbot planes for the individual exposure wavelengths. The pattern printed onto the substrate is therefore the integration, or average, of this range of distributions, and this is insensitive to increasing distance between the substrate and mask. This property of a stationary image is also entirely different to the behavior of the images of mask patterns produced by conventional projection, proximity or contact lithography techniques, for all of which the images show a strong variation in the direction of image propagation, thus restricting their range of application.

If ATL is applied to one-dimensional patterns of the line/space type, the stationary image printed onto the substrate usually exhibits spatial-frequency multiplication: the period of the pattern is generally reduced by a factor of two. In the case of two-dimensional patterns, the spatial-frequency of the printed pattern depends on the arrangement of the features in the mask. For example, if the mask has an array of clear holes on a square grid the ATL image generally consists of intensity peaks on a square grid with a period that is smaller than that in the mask by a factor of √2. On the other hand, when the mask has an array of holes on a hexagonal grid the ATL image generally consists of intensity peaks on a hexagonal grid with the same period. The intensity distribution in the ATL image produced by a particular mask pattern may be determined using modeling software that simulates the propagation of electromagnetic waves through masks and through space. Such simulation tools may therefore be used to optimize the design of the pattern in the mask for obtaining a particular printed pattern at the substrate surface.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the stationary image are generated by a part of the mask in which the period is substantially constant. The tolerance to such variation in period may be determined using modelling software of the kind mentioned above, and the patterns concerned may be characterized as being quasi-periodic.

A drawback of ATL is that it requires a relatively large separation between the mask and substrate, and so the spatial coherence and collimation of the illumination beam need to be much higher. For certain light sources, such as arc lamps, this is a problem because higher spatial coherence and collimation can only be achieved by greater spatial filtering, and this reduces the power in the illumination beam, which is undesirable for a production process.

Increasing the separation between mask and substrate also degrades the edges of the printed pattern. This occurs, firstly, because of Fresnel diffraction effects at the edges of the light-field transmitted by the mask, which get stronger as the propagation distance increases; and, secondly, because the different diffracted orders in the transmitted light-field diverge as they propagate, and so at the edges of the light-field there is imperfect overlap between the orders and therefore imperfect image generation, which gets worse with increasing separation.

The advantages offered by the ATL technique may also be obtained using another prior-art modification of the classical Talbot method. In this alternative scheme, which is disclosed in U.S. Pat. Appl. no. 2008/0186579, the periodic pattern in the mask is illuminated by a collimated beam of substantially monochromatic light and during exposure the substrate is displaced longitudinally relative to the mask by a distance corresponding substantially to an integer multiple of the separation between successive Talbot image planes. The technique, which may be called Displacement Talbot lithography (DTL), also results in the substrate being exposed to the entire range of lateral intensity distributions that occur between successive Talbot image planes, thereby also producing an integration, or averaging, of the range of lateral intensity distributions over the course of the exposure. Whereas the effects of the ATL and DTL techniques are essentially the same, in that they both produce stationary images with a large depth of focus and enable spatial-frequency multiplication, the DTL scheme also operates well with much smaller separations of the substrate and mask, so is advantageous in view of degradation at pattern edges and utilization efficiency of the light source. Further, the DTL technique is more suitable for printing high-resolution patterns over high topographies on the substrates; and it allows the use of laser source, which can be desirable for a production process.

A enhancement of the DTL technique is described in unpublished U.S. application Ser. No. 13/035,012 which is incorporated herein by reference. This application teaches that the exposure dose per incremental displacement of the photoresist-coated substrate relative to the mask be varied during the displacement instead of being constant. Preferably, the exposure dose per incremental displacement of the photoresist-coated substrate relative to the mask is varied according to a substantially Gaussian or similar profile whose FWHM corresponds to at least the Talbot distance of the light-field transmitted by the periodic pattern in the mask. It further teaches that the variation may be obtained by varying at least one of the speed of displacement and the intensity of the exposure beam during the displacement of the substrate with respect to the mask. This enhancement of the DTL technique enables periodic or quasi-periodic patterns to be printed more uniformly and reproducibly onto substrates than the original DTL method for which the size of the printed features is determined to be somewhat sensitive to deviations of the longitudinal displacement of the substrate from the specific values (integer multiple of the Talbot distance. This variant of the DTL technique further enables periodic patterns to be printed uniformly and reproducibly when the presence of 2nd or higher diffraction orders in the transmitted light-field from the mask prevents an exact Talbot imaging and an exact Talbot distance; and additionally enables two-dimensional periodic patterns of features to be printed uniformly and reproducibly printed onto substrates when the periods of the pattern are different along different axes or when the pattern also generates diagonally diffracted orders. It moreover enables patterns of features to be printed uniformly and reproducibly onto substrates when the period of the pattern in the mask is not constant but varies either continuously, as in chirped gratings, or step-wise across the mask. The form of the patterns printed by DTL at the substrate surface using one-dimensional and two-dimensional patterns in the mask are essentially the same as for ATL and can be determined using similar modelling software as mentioned above.

As for ATL, DTL is not restricted to purely periodic patterns but can also be applied to quasi-periodic patterns.

In fact, the same averaging of the entire range of lateral intensity distributions between successive Talbot image planes may also be achieved using a combination of the ATL and DTL methodologies. For example, if a (non-monochromatic) source with a bandwidth, $\Delta\lambda$, is employed and the substrate is arranged at a distance $d<d_{min}$ (see equ. (2) for ATL), then the required averaging effect may still be achieved by additionally longitudinally displacing the substrate relative to the mask, the displacement needed being less than that required by just DTL. By arranging $d<d_{min}$, the undesirable consequences of a large separation between substrate and mask can be reduced.

Using the ATL or DTL techniques (or a combination of partial forms thereof), it can be difficult and/or expensive, however, to design and realize mask patterns that can generate the intensity distributions required at the substrate surface for certain applications. Furthermore, they are too restrictive for generating images with intensity profiles that have large enough gradients at the edges of the features and have sufficiently high contrast for ensuring a high-yield production process. It is, moreover, desirable for some applications that the shapes of the holes printed from a particular mask can be changed without changing the mask. It is furthermore especially desirable that the period of the pattern printed from a particular mask can be significantly smaller than that e achieved using the prior-art teaching standard ATL or DTL. A smaller period of printed pattern can be advantageous for obtaining higher performance from the manufactured device, as well as enabling the printed patterns to be employed in other fields of application. Alternatively, enabling a larger period of pattern in the mask for a particular period of printed pattern is advantageous for reducing the manufacturing cost of the mask, especially if the size of the pattern is large.

It is therefore the purpose of the present invention to provide a solution to overcome the above-described limitations and disadvantages of achromatic Talbot lithography and displacement Talbot lithography as taught in the prior art. Specifically, it is a first object of the invention to provide a cost-effective and more versatile lithographic method and apparatus for printing a larger variety of high-resolution patterns onto substrate surfaces to satisfy a range of fields of application and for ensuring a high-yield production process. It is a second object of the invention to provide a lithographic method and apparatus that enable a more efficient utilization of light from the illumination source in order to improve productivity and reduce costs in the manufacturing process. It is a third objective of the present invention to provide a lithographic method and apparatus that enable the period of the pattern printed from a particular mask to be significantly smaller, and the resolution of the printed features to be substantially higher, than the respective values achieved using the prior-art teaching ATL or DTL.

BRIEF SUMMARY OF THE INVENTION

According to a first aspect of the present invention, a photolithographic method is provided for printing a desired periodic or quasi-periodic pattern of features into a photosensitive layer, which method includes:
a) providing a mask bearing a periodic or quasi-periodic mask pattern of features;
b) providing a substrate bearing the photosensitive layer;
c) arranging the substrate parallel to and with a separation from the mask;
d) generating light with a central wavelength and a spectral bandwidth;
e) illuminating said mask pattern with said light at different angles of incidence to deliver a selected angular distribution of illumination energy density such that the light of each wavelength at each angle transmitted by the mask forms a range of lateral intensity distributions between Talbot planes, and one of maintaining and changing the separation during the illumination such that the light at each angle of incidence exposes the photosensitive layer to substantially the entire range of lateral intensity distributions, the superposition of which prints the desired pattern;
wherein the angular distribution and mask pattern are selected in conjunction with the separation for printing the desired pattern.

If the light has a significant spectral bandwidth, the separation is most preferably selected in relation to the spectral bandwidth according to the technique of ATL, so that the light at each angle of incidence exposes the photosensitive layer to substantially the entire range of lateral intensity distributions and forms a stationary image, and the separation is preferably maintained at constant value during the illumination.

If the light is substantially monochromatic, the separation is most preferably changed during the illumination by at least the distance between Talbot planes according to the technique of DTL, so that the light at each angle of incidence exposes the photosensitive layer to substantially the entire range of lateral intensity distributions. Most preferably, the exposure dose per incremental displacement of the photoresist-coated substrate relative to the mask should be varied during the displacement in order that the exposure dose per incremental displacement of the photoresist-coated substrate relative to the mask varies over the changing separation according to a substantially Gaussian or similar profile whose FWHM is at least the distance between Talbot planes.

Preferably, the selected angular distribution of illumination energy density at the mask is obtained by illuminating the mask pattern simultaneously with light at the different angles of incidence. Alternatively, it may be obtained by illuminating the mask pattern with light at the different angles of incidence sequentially.

The illumination energy density may be angularly distributed punctually, at a plurality of discrete angles; or, it may be distributed continuously over a range or ranges of angles. In both cases, the angles may lie in a single plane of incidence at the mask, or may not be restricted to a single plane and have changing angular components in orthogonal planes of incidence.

Each part of the mask pattern is most preferably illuminated with substantially the same angular distribution of exposure energy density.

Both the desired pattern and the pattern in the mask may be periodic or quasi-periodic in just one direction or in more than direction. For example they may be linear gratings or two-dimensional arrays of features arranged on, for example, hexagonal or square grids. The periods of the desired and mask patterns may be constant over the areas of the patterns or, in the case of quasi-periodic patterns, may vary slowly over the respective patterns so that locally the periods may be considered, with respect to image formation by the ATL or DTL techniques, as constant.

The invention is based on the principle that the patterns printed by both the ATL and DTL techniques are stationary, that is, they are substantially insensitive to the separation of the mask and substrate, and so have a relatively large depth of focus. It is further based on the property that an adjustment to the angle of incidence of the beam illuminating the mask causes the light-field exposing the photoresist to displace laterally but otherwise remain substantially the same. The magnitude of the lateral displacement is proportional to the separation of the mask and substrate and to the change in angle of incidence. Thus, when a beam or beams with more than one angle of incidence is or are used to illuminate the mask, then the net pattern printed into the photoresist is an integration, or average, of the patterns printed at the different angles. The net integrated intensity distribution exposing the photoresist using a particular mask pattern and a particular angular distribution of illumination may be determined by firstly calculating the product of the angular distribution and the separation of the mask and substrate, and then convolving the result with the integrated intensity distribution produced at the photoresist by the ATL or DTL technique when illuminating the mask just at normal incidence. This description and calculation assume that the light-fields in the images formed by the different angular components are mutually incoherent, which is the case for the main embodiments of the invention. If, however, a laser source is being employed to generate the angular distribution in a simultaneous manner, the light-fields of the different angular components may be mutually coherent, in which case the intensity distribution exposing the photoresist should be calculated by firstly adding the electric-fields distributions of the different angular components, taking account of their relative phases, before determining the intensities and then integrating over the change of separation between mask and wafer performed for the DTL.

The method of the invention allows a high degree of control over the intensity distribution in the image of the periodic pattern of features printed onto the substrate surface, in particular with respect to i) the shape of features in the plane of the substrate surface, ii) the slope of the intensity profile at the edges of the features, iii) the intensity contrast of the features, iv) higher spatial frequency of the periodic features in the printed pattern compared to that of the periodic features in the mask (or, correspondingly, smaller period of the printed pattern compared to that of the pattern in the mask, v) array symmetry (i.e. square, rectangular, hexagonal, "honeycomb", etc) of the printed pattern compared to that in the mask, and vi) the depth of focus of the image. It therefore enables a considerably greater variety of periodic patterns to be printed in comparison with the prior art techniques of achromatic Talbot lithography and displacement Talbot lithography, whilst substantially retaining the major advantage of those techniques, that is, a large depth of focus for high-resolution periodic patterns. Consequently, the method of the invention allows a much greater range of applications than ATL and DTL according to the prior art.

For printing a pattern of features with a period that is smaller than that in the mask, it is advantageous that the integrated intensity distribution produced at the photosensitive layer by the prior-art ATL or DTL techniques using a single angle of illumination possesses secondary, lower-intensity peaks between the main peaks. In this case, it is most advantageous that a plurality of discrete angles of incidence are employed to illuminate the mask and that the angles are selected so that the main intensity peaks in the integrated distributions formed by each angle of incidence are substantially aligned with the locations of the secondary peaks formed by the other angles of illumination. They may alternatively be selected so that the main intensity peaks formed by each angle of illumination are aligned with the locations of the secondary and main peaks formed by the other angles of illumination. By so doing, the intensity peaks in the superposed integrated distributions are formed with high contrast which is most desirable for a lithographic manufacturing process.

According to a second aspect of the present invention, a photolithographic apparatus is provided for printing a desired periodic or quasi-periodic pattern of features into a photosensitive layer, which apparatus includes:
a) a mask bearing a periodic or quasi-periodic mask pattern of features;
b) substrate bearing the photosensitive layer;
c) a means for arranging the substrate parallel to and with a separation from the mask;
d) a light generation system for providing light with a central wavelength and a spectral bandwidth;
e) a means for illuminating said mask pattern with said light at different angles of incidence to deliver a selected angular distribution of illumination energy density such that the light of each wavelength at each angle transmitted by the mask forms a range of lateral intensity distributions between Talbot planes;
f) a means for one of maintaining and changing the separation during the illumination such that the light at each angle of incidence exposes the photosensitive layer to substantially the entire range of lateral intensity distributions.

Preferably, the illumination source is either a discharge lamp or a light emitting diode that generates light with a relatively large spectral bandwidth, or alternatively is a laser that generates light with very narrow spectral bandwidth.

Preferably, the optical system for generating a beam with an extended angular distribution includes a binary mask or a gray-scale mask.

Advantageously, the method may include introducing a liquid between the mask and the substrate in order to enhance the resolution of the photolithographic system.

Most preferably, a computer and simulation software are employed for selecting and optimizing the angular distribution in conjunction with the mask pattern and the separation for printing the desired pattern.

BRIEF DESCRIPTION OF THE SEVERAL VIEWS OF THE DRAWINGS

The above and/or other aspects of the present general inventive concept will become apparent and more readily appreciated from the following description of the exemplary embodiments, taken in conjunction with the accompanying drawings, in which.

DETAILED DESCRIPTION OF THE INVENTION

Figure 1:
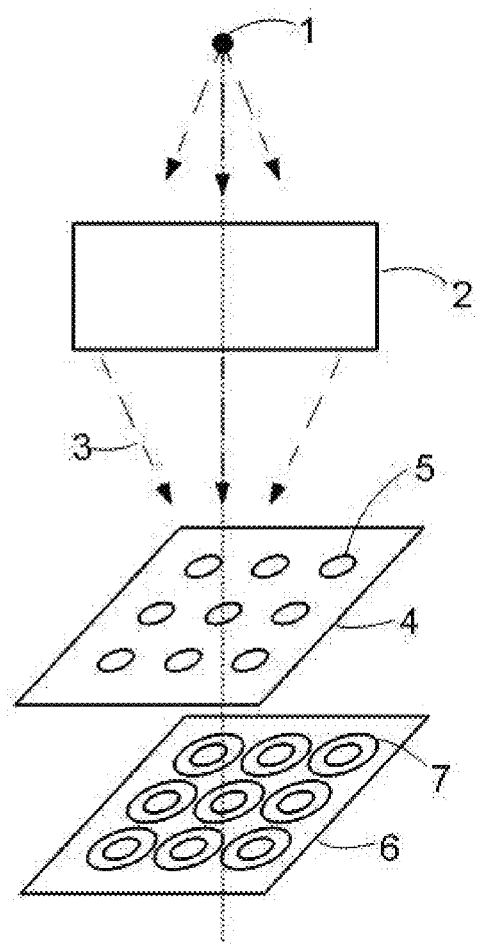
FIG. 1 shows the general concept of the present invention.

With reference first to FIG. 1, which illustrates the general concept of the present invention, an illumination source 1 generates light with a certain spectral bandwidth, which is incident on an optical system 2 that transforms the input beam into a light-field 3 for illuminating a mask 4. The light-field 3 illuminating the mask 4 is not collimated (i.e. its rays are not parallel) as employed in the prior art teachings of ATL and DTL, but rather illuminates each point in the mask with a particular angular distribution of rays. It should be understood that many different types and configurations of optical system 2 may be devised by experts in the field of optical engineering to achieve the above-described optical transformation, especially in view of the wide range of both exposure wavelengths and associated types of exposure source that may be employed with the present invention. The mask 4 contains a pattern of features 5 that is periodic in, in this example, two directions that diffracts the illumination beam 3. Below the mask 4 is located a substrate 6 having a photosensitive upper surface that is arranged substantially parallel with the mask 4. The exposure conditions are arranged so that during the course of the exposure the photosensitive layer on the substrate 6 is exposed to substantially the full range of lateral intensity distributions that are generated between successive Talbot planes generated by each angular component of illumination for the wavelengths concerned. If the illumination source 1 has a significant spectral bandwidth, this is preferably achieved by arranging the distance between the substrate 6 and mask 4 to be sufficiently large such that each angular component of illumination forms a stationary image at the photosensitive layer, as is taught by achromatic Talbot lithography for the case of collimated illumination (at a constant angle). If, on the other hand, the illumination is substantially monochromatic, it is preferably achieved by longitudinally displacing the substrate 6 relative to the mask 4 during the exposure by at least the separation between successive Talbot planes formed by each angular component of the illumination, as is taught by displacement Talbot lithography for the case of collimated illumination (at a constant angle). A combination of these two approaches might also be employed. These exposure conditions prints a periodic pattern 7 onto the substrate 6, whose intensity distribution may be calculated by convolving the intensity distribution generated at the substrate 6 by a collimated beam with the product of the angular distribution of illumination 3 incident on the mask 4 and the separation of the mask 4 and substrate 6.

Exemplary embodiments of the present invention are now described in more detail to more clearly explain the general inventive concept.

Figure 2:
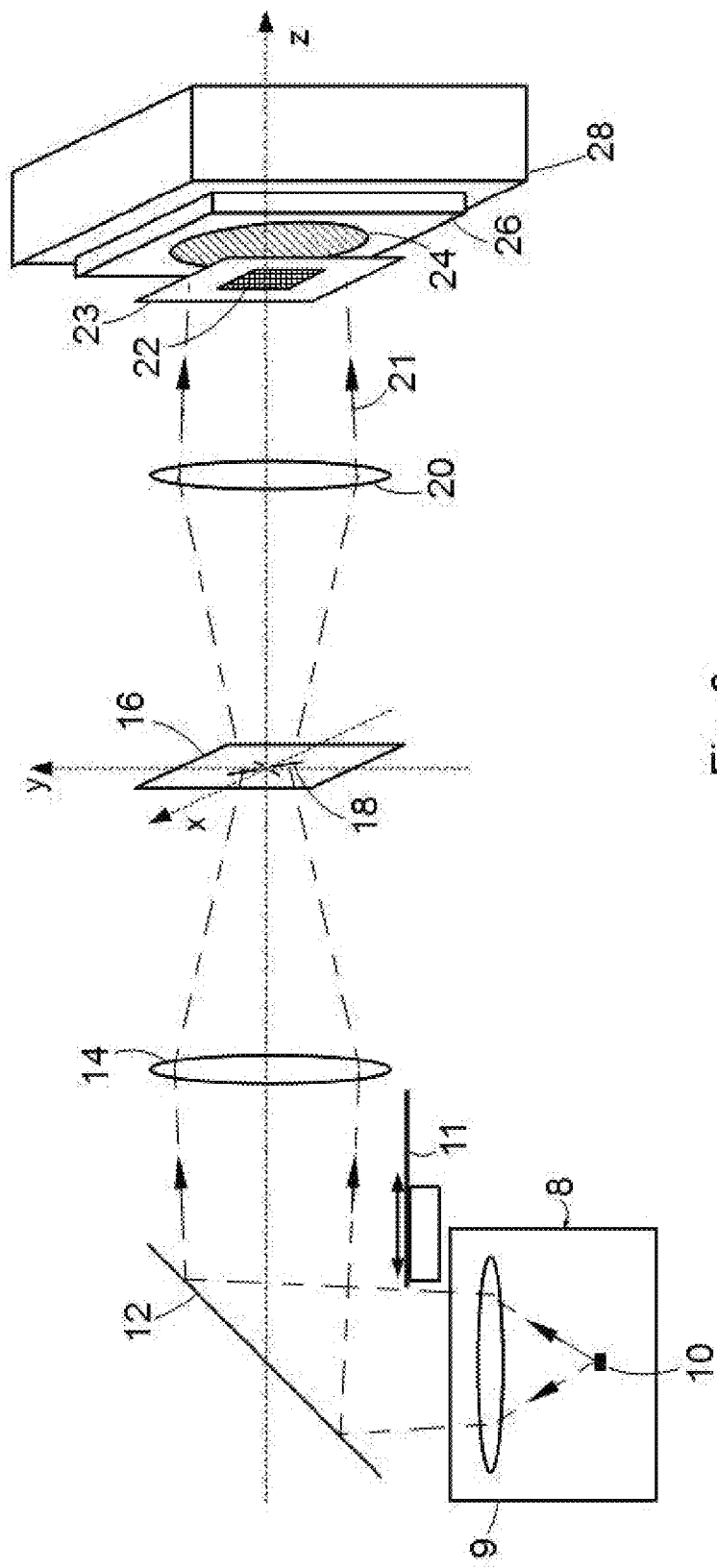
FIG. 2 shows a first exemplary apparatus employed in a first set of embodiments of the present invention, which employs an illumination source with a relatively broad spectral bandwidth.

FIG. 2 shows a first exemplary apparatus that is employed in a first set of embodiments. The light source is a commercially available 500 W mercury-xenon arc lamp unit 8 that generates a broad spectrum of light including a component in the deep ultra-violet (DUV). The lamp unit 8 has a condenser lens 9 with a focal length ~50 mm that produces a 40 mm-diameter beam with good uniformity of intensity. Since the effective size of the arc 10 in the lamp unit 8 is ~2.5 mm×2.5 mm and the arc 10 is located in the focal plane of the condenser lens 9, the range of angles of the light rays in the output beam from the lamp unit 8 is ~±25 mR. After passing through an open electronically controlled shutter 11, the beam is incident on a dielectric mirror 12 that is highly reflective in the spectral range ~220-260 nm and highly transmissive outside of this range. The resulting beam of DUV light with a bandwidth ~40 nm that is reflected by this mirror 12 illuminates a lens 14 with focal length 100 mm which focuses the light to a spot of dimensions ~5 mm×5 mm on the surface of an angular distribution mask 16 located in the back focal plane of the lens 14. The angular distribution mask 16 comprises one or more open areas 18 in a layer of chrome on a fused silica substrate.

The angular distribution mask 16 is also coplanar with the front focal plane of another lens 20 with focal lens 100 mm, and the light transmitted by the open areas 18 in the angular distribution mask 16 are projected by this lens 20 to form a beam 21 that illuminates a periodic pattern 22 in a pattern mask 23. Because of this optical arrangement and a well known optical principle, the angular distribution of the light in the beam illuminating the pattern mask 23 corresponds to the intensity distribution transmitted by the angular distribution mask 16 or, more specifically, each point at coordinates (x, y) in an open area of the angular distribution mask 16 generates a ray of light that illuminates the pattern mask 23 at an angle of incidence given by $$(\theta_x, \theta_y) = (\tan^{-1}(x/f), \tan^{-1}(y/f)),  \quad \text{equ. (3)}$$

where $\theta_x$, and $\theta_y$ are the angular components of the beam in the xz and yz planes respectively and f is the focal length of lens 20.

Given that, in this particular apparatus, the size of the spot illuminating the angular distribution mask 16 is ~5 mm×5 mm and the focal length of lens 20 is 100 mm, the largest extent of the angular distribution that can be produced by the angular distribution mask 16 is ~±25 mR.

The lenses 9, 14, 20 are only schematically shown in FIG. 2. It should be understood by those expert in the field of optical design that each is not necessarily a simple bi-convex lens as indicated but may have another shape, or indeed be a combination of two or more lens elements, in order that the resulting geometric and chromatic aberrations are reduced to acceptable values. Further, the optical function of, for example, lens 20 may be alternatively performed, in other embodiments of the invention, by a reflective optical system comprising one or more mirrors. Thus, in more general terms, the angular distribution mask employed in embodiments of the present invention for forming the angular distribution of illumination (from either a source with large spectral bandwidth or a substantially monochromatic one) should preferably be located in or near the front focal plane of an infinite conjugate imaging system.

In proximity with the pattern mask 23 is a silicon wafer 24 that has been spin-coated with a layer of a standard DUV-sensitive photoresist. The wafer 24 is held by a vacuum chuck 26 that is mounted to a stage system 28 (only shown schematically in the diagram). The stage system 28 incorporates micrometer actuators for adjusting, firstly, the angular tilt of the wafer 24 in both xz and yz planes and, secondly, the separation of the wafer 24 and pattern mask 23. Using the stage system 28 and also mechanical spacers of known thickness (not shown in the figure), the wafer 24 may be positioned substantially parallel to the mask 23 and at a particular distance from it. The separation of the mask and wafer may be alternatively measured using an optical system such as one based on white-light interferometry.

Using this apparatus, in which the illumination from the exposure source 8 has a relatively broad bandwidth of ~40 nm, the exposure of the photoresist layer on the wafer 24 to the required range of lateral intensity distributions produced between successive Talbot images is preferably achieved by adjusting the distance of the wafer 24 from the mask 23 such that each angular component of illumination forms a stationary image at the surface of the wafer 24 according to ATL. The distance required depends on the period of the pattern 22 in the pattern mask 23 and the spectral bandwidth of the illumination source 8, as defined in equ. (2). Following adjustment of the position of the wafer 24 so that it is orientated substantially parallel to the mask 23 and separated from it by the required value, the lithographic exposure may proceed.

Depending on the intensity of the exposure beam 21 illuminating the mask 23 and on the photoresist process, the duration of the exposure should be selected, using the electronically controlled shutter 11, such that following development of the photoresist the desired dimensions of printed features are obtained in the photoresist. The exposure time should be optimized together with the photoresist process using evaluation procedures for microstructures well-known to those skilled in the art. Examples of periodic structures that can be printed using this apparatus, by illuminating particular pattern masks 23 with a variety of angular distributions, in different embodiments of the invention, are shown later in this section.

Figure 3:
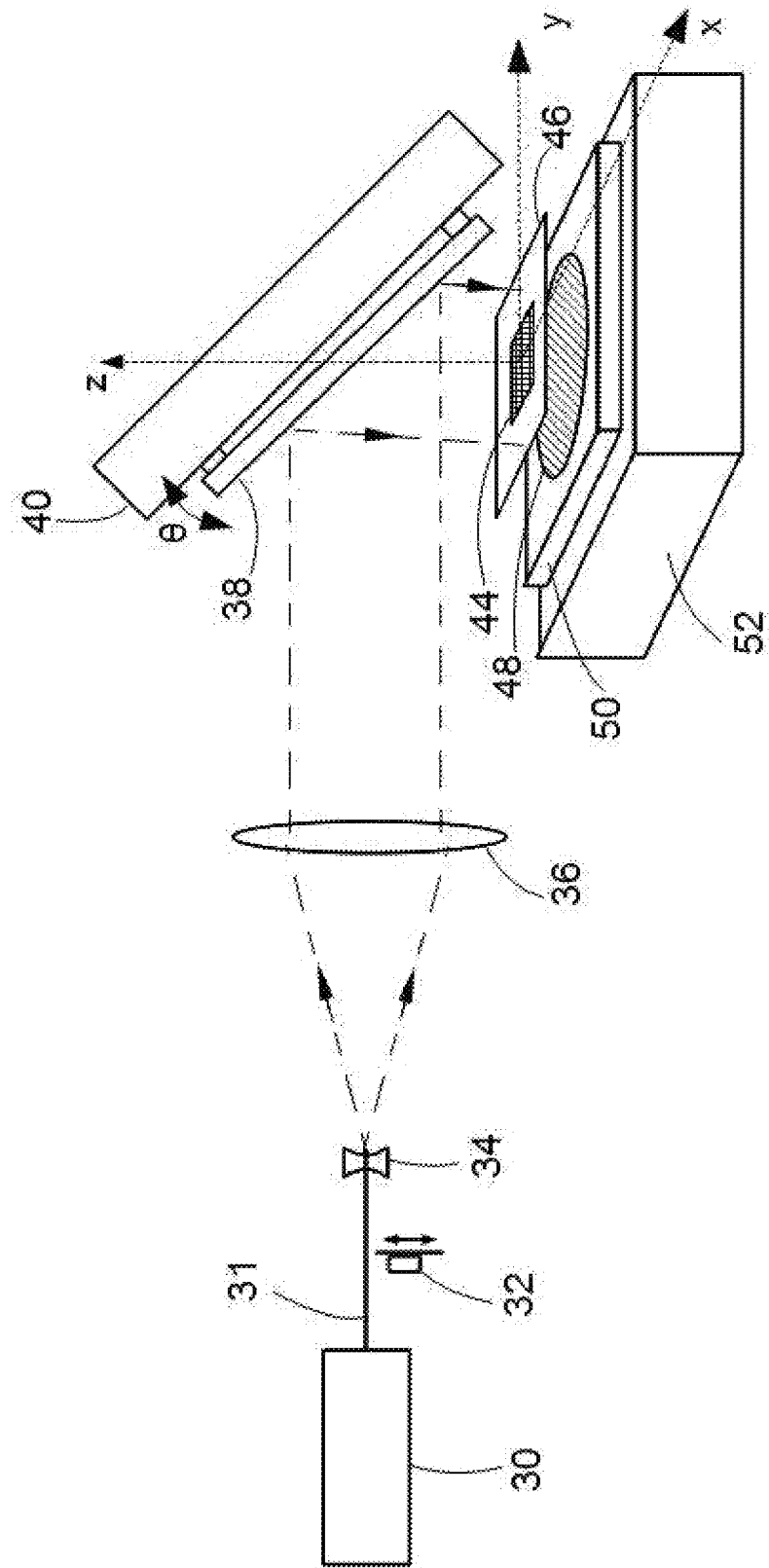
FIG. 3 shows a second exemplary apparatus employed in a second set of embodiments of the present invention, which employs a substantially monochromatic illumination source.

FIG. 3 shows a second exemplary apparatus which is employed in a second set of embodiments. The light source is a pulsed frequency-quadrupled diode-pumped solid-state laser 30 that emits a collimated beam of pulsed light 31 with wavelength 266 nm and an average output power 2 W. The cross-section of the beam 31 has a substantially Gaussian intensity profile with a $1/e^2$-diameter of ~5 mm. The beam 31 may be blocked by an electronically controlled shutter 32. When the shutter 32 is open the beam 31 is incident on a first, concave lens 34 of a beam expander, from which the light diverges and is then recollimated the second, convex lens 36 of the beam expander. The ratio of the focal lengths of the convex and concave lenses 34, 36 produces an expanded beam with a $1/e^2$-diameter of 50 mm. This beam is incident on a mirror 38 that reflects the beam so that illuminates a periodic pattern 44 in a pattern mask 46, the size of the pattern 44 being ~10 mm×10 mm. The mirror 38 is mounted to a mirror stage 40 that incorporates actuators 42 that allow the beam 39 reflected from the mirror to be angularly adjusted in the xz and yz planes with an angular resolution of 0.1 mR and over a range of ±100 mR. In proximity with the mask 46 is a photoresist-coated wafer 48 held on a vacuum chuck 50 that is mounted to a stage system 52. The stage system 52 incorporates piezo-electric actuators that enable, firstly, the angular tilt of the wafer 48 to be adjusted with respect to the pattern mask 46 in both xz and yz planes and, secondly, the wafer 48 to be longitudinally displaced with respect to the mask 46 with a resolution of 10 nm.

Before exposure, the piezo-electric actuators of the stage system 52 are employed in conjunction with mechanical spacers of known thickness (not shown) to adjust the wafer 48 so that it is positioned substantially parallel to the mask 46 and at a particular distance from it. Following this the actuators 42 in the mirror stage 40 are adjusted so that, with the shutter 32 open, the mask 46 and wafer 48 are orientated substantially perpendicular to the illumination beam 39. The latter condition may be verified by observing the beam reflected from the mask 46 in relation to the incident beam 39, which is a standard alignment procedure well-known to optical engineers. This latter procedure calibrates the tilting mechanism of the stage 40 with respect to the illumination angle at the pattern mask 46.

Different types of exposure strategy may be used with this apparatus. If the desired angular distribution of the illumination beam comprises a plurality of discrete angles, then the preferred strategy is to tilt the mirror 38 so that the beam 39 sequentially illuminates the pattern mask 46 at each of the discrete angles. At each angle the shutter 32 is opened for the appropriate time so that the relative exposures correspond to the required distribution (in the simplest case the exposure dose required at each angle would be the same), and during each exposure the separation of the wafer 48 and mask 46 is changed by a distance corresponding substantially to the separation of successive Talbot image planes for the wavelength concerned (as taught by DTL in the case of collimated illumination at a particular angle); thereby exposing the photoresist to substantially the entire range of lateral intensity distributions between successive Talbot image planes. The distance required depends on the period of the pattern in the pattern mask 46 and on the illumination wavelength, as defined in equ. (1). The exposure times for each angle should also be selected in relation to the intensity of the illumination beam 39 and the photoresist process so that the features printed into the photoresist have the desired dimensions.

If, on the other hand, the required angular distribution comprises a continuous distribution, then the preferred exposure strategy is rather to perform an angular scan of the mirror 38 in a continuous manner, for example, following a raster scan pattern. During the scanning the shutter 32 is preferably closed and then opened when the beam changes direction at the ends of each scan pass in the raster pattern, so that the time-integrated exposure accurately corresponds to the required distribution. Simultaneously and continuously with this scanning, the separation between the wafer 48 and mask 46 is repeatedly varied by the distance corresponding to the separation of successive Talbot image planes, and preferably in an oscillating manner with an suitably high frequency to ensure that the separation is varied by the required distance during exposure of the mask to each angle of illumination.

In other embodiments, substantially the same apparatus may be employed with a more sophisticated exposure strategy. For example, the intensity of the laser beam 31 may be additionally varied during the angular scan and/or the speed of angular scan of the mirror 38 may be varied during the angular scan, so that the time-integrated exposure corresponds to the required angular distribution.

Whereas this apparatus angularly displaces the illumination beam 39 during the exposure, the same result may be achieved, in equivalent embodiments, by angularly displacing instead the pattern mask and wafer together during the exposure whilst keeping the illumination beam stationary, so that the same relative angular displacement is achieved between the beam and the mask-and-wafer sub-system.

Examples of periodic structures that can be printed in different embodiments of the present invention, using the ATL-based scheme of the first exemplary apparatus and the DTL-based scheme of the second exemplary apparatus, by illuminating a periodic pattern in a mask with an angular distribution of light whilst exposing a photoresist-coated wafer to the transmitted light such that the light of each angle of incidence exposes the wafer according to ATL or DTL, are shown below.

In order to demonstrate the superiority and versatility of the present invention with respect to the prior-art techniques of ATL and DTL, the patterns printed from exemplary masks using the present invention are compared with those printed using those prior-art techniques.

Figure 4:
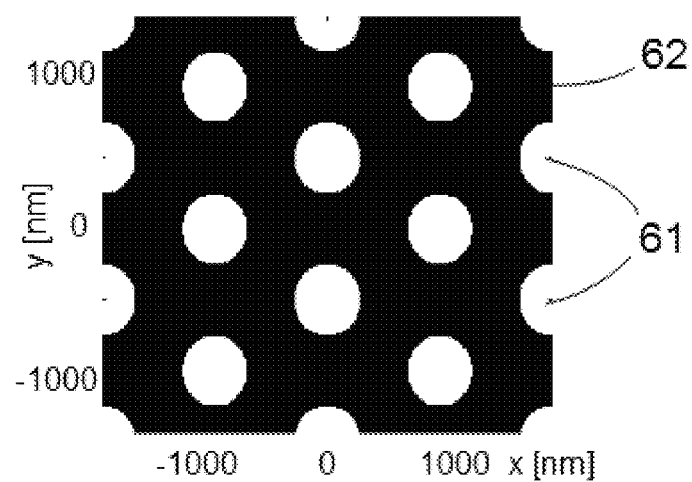
FIG. 4 shows a section of a periodic pattern of holes on a hexagonal grid in a mask.
Figure 5:
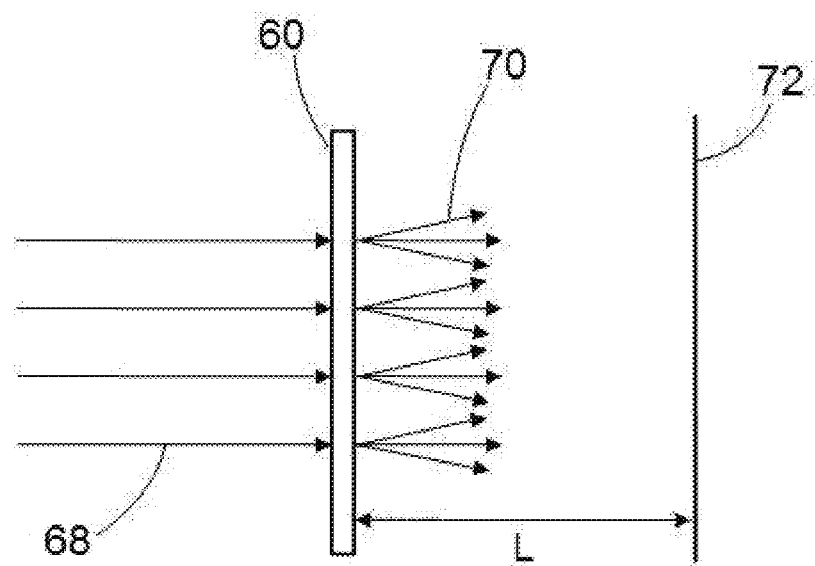
FIG. 5 shows the illumination of a mask using a collimated beam for generating a stationary image according to the prior art.
Figure 6A:
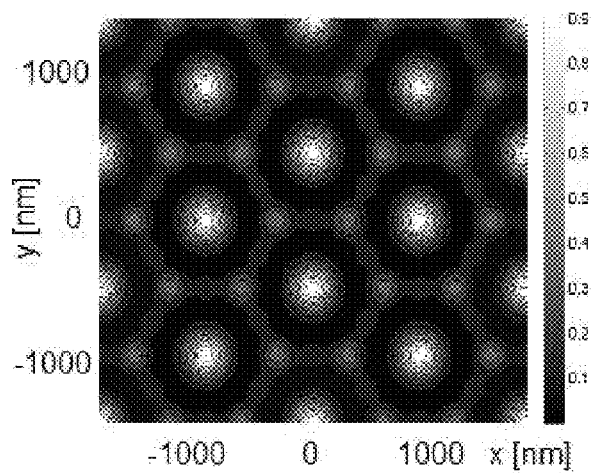
FIGS. 6a, 6b and 6c show respectively the stationary image generated by illuminating the periodic pattern of FIG. 4 with a collimated beam according to the prior art, the intensity profile along an axis of said image, and the resulting pattern printed into photoresist.
Figure 6B:
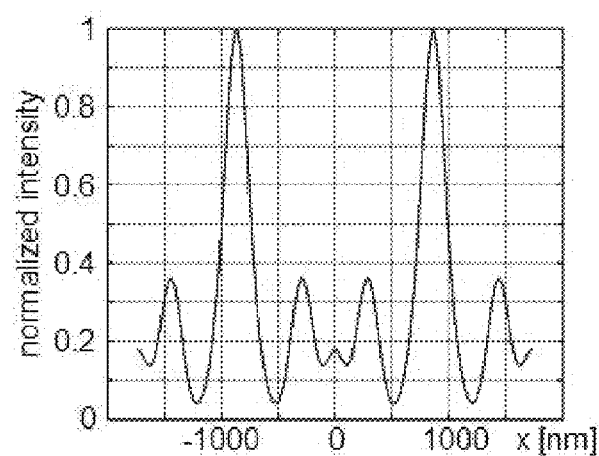
Figure 6C:
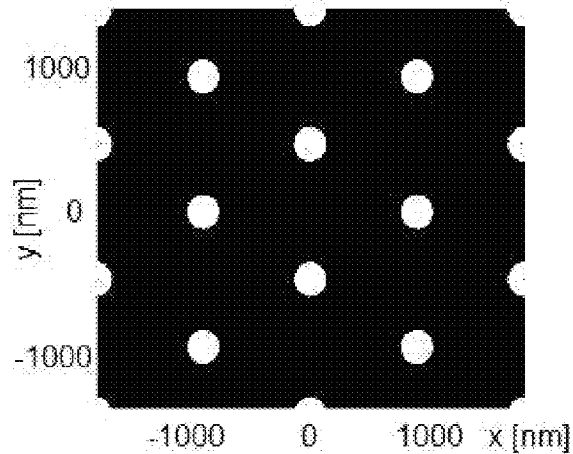

A first periodic pattern with area 30 mm×30 mm is composed of holes 60 arranged on a hexagonal grid that are etched into a 40 nm-thick layer of chrome 62 on the surface of a fused silica substrate. The nearest-neighbour distance of the holes 60 in the grid is 1 μm and their diameter is 0.5 μm, as illustrated by a section of the pattern design shown FIG. 4. The surface of the fused silica substrate within the holes 60 has been additionally etched to maximize the contrast of the image that is formed using the ATL or DTL technique, according to the prior art. If the mask is exposed according to the prior-art technique of ATL, by illuminating it at normal incidence with a collimated beam 68 with a certain wavelength and bandwidth then, with reference to FIG. 5, the periodic pattern in the mask 66 generates diffraction orders at each wavelength which propagate away from the mask 66 and illuminate a substrate 72 located substantially parallel to and at a certain distance from the mask 66. This distance, L, is selected to be at least the minimum value required for forming a stationary image according to the ATL technique, as given by equ. (2). So if hexagonal-array of FIG. 4 is illuminated with light having a spectral bandwidth ~40 nm (and central wavelength 240 nm), then the distance, L, should be at least ~40 μm. The intensity distribution of light illuminating the substrate 72 may be determined by computer simulation of the diffraction of the light by the mask pattern and its propagation from the mask, and then integrating the interference patterns formed by each spectral component at the surface of the substrate 72. The result of performing this for the particular pattern and illumination conditions concerned is shown in FIG. 6a, and a profile of the intensity variation across the centre of this image is shown in FIG. 6b. A photolithographic exposure and development process is additionally simulated using standard computational techniques in order to determine the pattern printed by the intensity distribution of FIG. 6a. into a layer of positive-tone photoresist. The result is shown in FIG. 6c. As can be seen, the pattern printed using an illumination scheme according to the prior art is also a hexagonal array of holes, with the same period as that of the periodic pattern in the mask and with a hole diameter significantly less than that in the mask. The hole diameter may be adjusted to some extent by adjusting the exposure dose.

To illustrate different embodiments of the invention, the mask illustrated in FIG. 4 is illuminated, using the exemplary apparatuses of FIGS. 2 and 3, with different angular distributions of light whilst exposing a photo-resist coated wafer so that the light of each angular component of illumination transmitted by the mask exposes the wafer according to the respective ATL or DTL techniques.

Using the exemplary apparatus of FIG. 2, an angular distribution mask 16 for the desired distribution is first fabricated according to the design rule of equ. (3) and inserted into the apparatus. Before illumination of the mask pattern, a photoresist-coated wafer 24 is loaded onto the vacuum chuck 26 and positioned so that it is substantially parallel to the pattern mask 23 and separated from it by a distance of ~60 μm. This value is larger than the minimum distance required by ATL for producing a stationary image from a pattern of period 1 μm using collimated light of spectral bandwidth ~40 nm.

Using the second exemplary apparatus of FIG. 3, an exposure sequence is devised for generating the desired angular distribution of illumination, which may be either a plurality of discrete angles or a continuous range of angles. Similarly, before illuminating with the desired angular distributions, a photoresist-coated wafer 48 is loaded to the chuck 50 and positioned so that it is substantially parallel to the pattern mask 46 and also at a distance of ~60 μm. Since this apparatus employs the DTL technique, the initial distance is less important. During exposure of the wafer 48 to the angular distribution of illumination, the wafer 48 is longitudinally displaced with respect to the pattern mask 46 by a distance of ~5.6 μm, which corresponds to the separation between successive Talbot planes as determined using equ. (1) for the particular mask pattern and illumination wavelength concerned, so that the wafer is exposed to the entire range of lateral intensity distributions between successive Talbot planes according to the DTL method.

The resultant, or net, image that illuminates the photoresist using a particular mask pattern, particular angular distribution of illumination and either of the two second exemplary apparatuses may be determined by firstly calculating the product of the angular distribution and the separation of the mask and wafer, and then convolving this distribution with the integrated intensity distribution that would be formed at the wafer surface by illuminating the mask with a single angle of incidence according to ATL or DTL according to the prior art. The intensity variation along a central or another axis of the image may then be readily determined from this distribution, and the resulting pattern printed into a layer of positive-tone photoresist may be estimated from by applying a threshold to the distribution.

Using such mathematical treatment it is possible to design the periodic mask pattern and the angular distribution required for printing the desired periodic pattern of features onto the substrate. For instance, the shape of the pattern features (in the plane of the photoresist) can be optimized to a particular geometry; the slope of the intensity profile at the edges of the features and the image contrast can be maximized in order that to ensure the dimensions of the features can be printed uniformly and reproducibly; a particular multiplication of spatial frequency from mask pattern to printed pattern (i.e. reduction in period) may be obtained; the array symmetry (i.e. square, rectangular, hexagonal, "honeycomb", etc) may be changed from that produced by ATL or DTL (i.e. a "honeycomb" array may be printed instead of a hexagonal pattern); and/or the depth of focus of the pattern may be optimized with respect to its other properties.

Figure 7A:
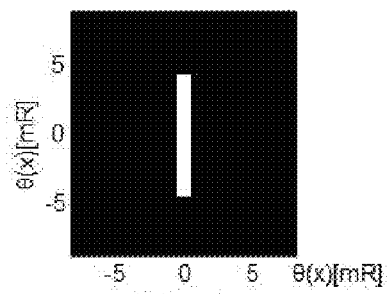
FIGS. 7a, 7b, 7c and 7d show respectively a rectangular angular distribution for illuminating, according to the present invention, a periodic pattern on a hexagonal grid, the intensity distribution in the resulting image, the intensity profile along an axis of said image, and the resulting pattern printed into photoresist.
Figure 7B:
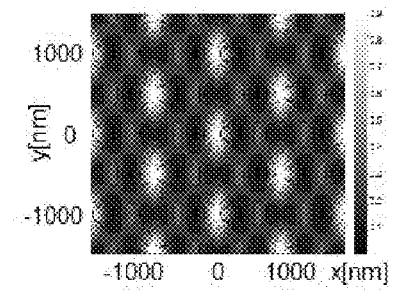
Figure 7C:
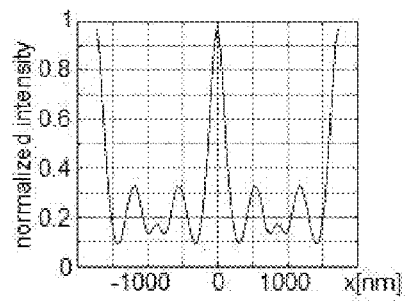
Figure 7D:
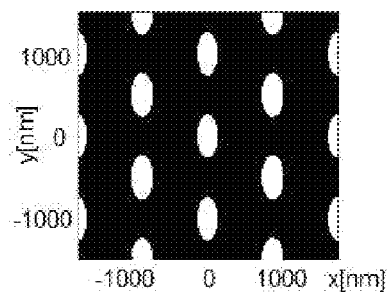

In one embodiment the rectangular angular distribution of FIG. 7a is employed to illuminate the mask of FIG. 4. The resultant integrated intensity distribution that exposes the photoresist is shown in FIG. 7b and the intensity variation across the central axis of the distribution is shown in FIG. 7c. The resulting pattern printed into photoresist is illustrated in FIG. 7d. This example demonstrates the capability of the present invention for printing an array of elongated features on a hexagonal grid.

Figure 8A:
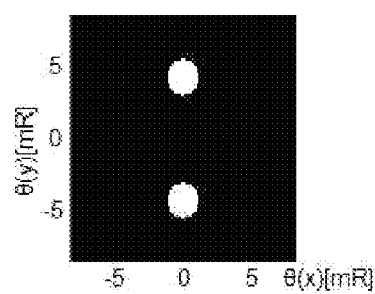
FIGS. 8a, 8b, 8c and 8d show an angular distribution comprising two circular zones for illuminating, according to the present invention, a periodic pattern on a hexagonal grid, the intensity distribution in the resulting image, the intensity profile along an axis of said image, and the resulting pattern printed into photoresist.
Figure 8B:
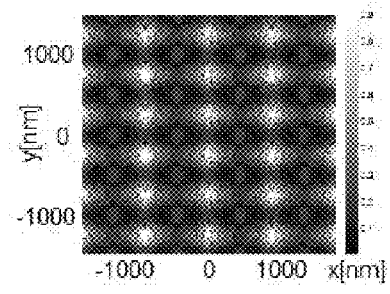
Figure 8C:
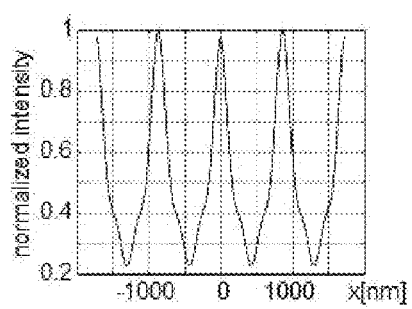
Figure 8D:
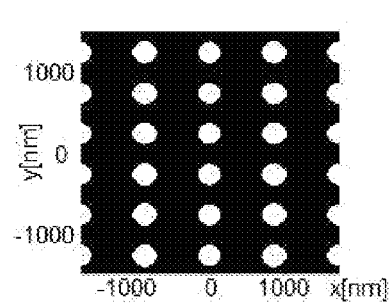

In another embodiment, the angular distribution of FIG. 8a is employed, which is composed of two circular zones. The resultant integrated intensity distribution that exposes the photoresist is shown in FIG. 8b and the intensity variation across an axis of this distribution is shown in FIG. 8c. The resulting pattern printed into photoresist is illustrated in FIG. 8d. This example demonstrates the capability of the present invention for printing a periodic pattern on a rectangular grid from a mask with periodic pattern on a hexagonal grid, and also for printing a periodic pattern with a period substantially smaller than that in the mask.

Figure 9A:
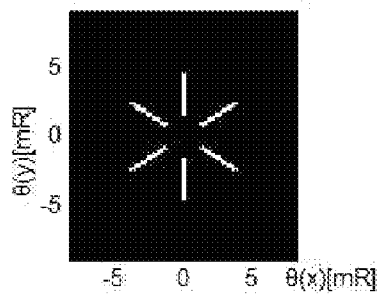
FIGS. 9a, 9b, 9c and 9d show respectively an angular distribution comprising six rectangular zones for illuminating, according to the present invention, a periodic pattern on a hexagonal grid, the intensity distribution in the resulting image, the intensity profile along an axis of said image, and the resulting pattern printed into photoresist.
Figure 9B:
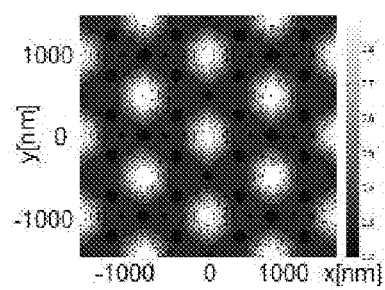
Figure 9C:
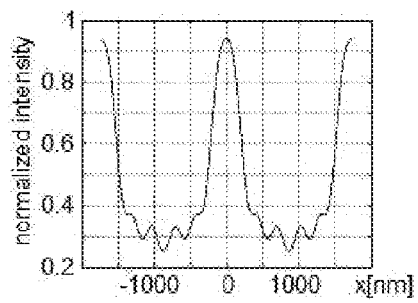
Figure 9D:
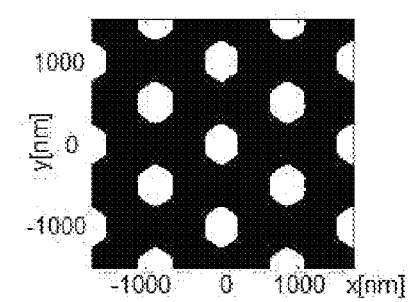

In another embodiment, the angular distribution of FIG. 9a is employed, which is composed of 6 lines symmetrically arranged around a central point. The resultant integrated intensity distribution that exposes the photoresist is shown in FIG. 9b and the intensity variation across a central axis of this distribution is shown in FIG. 9c. The resulting pattern printed into photoresist is illustrated in FIG. 9d. This example demonstrates the capability of the present invention for printing periodic patterns whose features have shapes that are significantly different from those in the mask, and for printing hexagonal shapes.

Figure 10A:
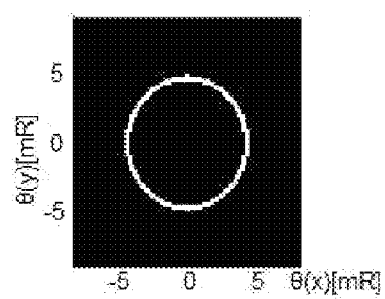
FIGS. 10a, 10b, 10c and 10d show respectively an annular angular distribution for illuminating, according to the present invention, a periodic pattern on a hexagonal grid, the intensity distribution in the resulting image, the intensity profile along an axis of said image, and the resulting pattern printed into photoresist.
Figure 10B:
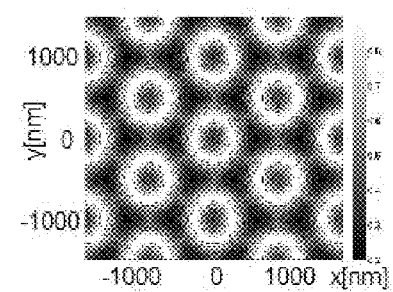
Figure 10C:
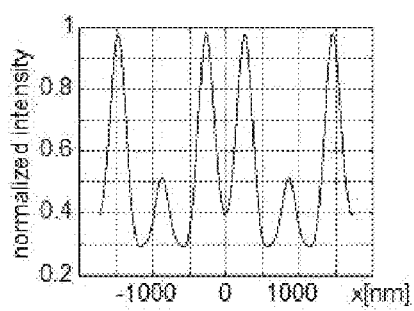
Figure 10D:
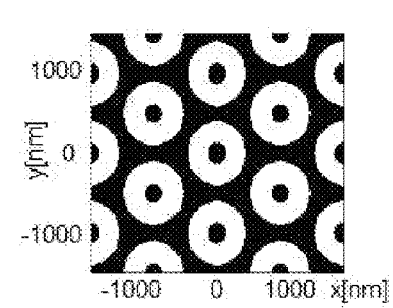

In another embodiment, the annular angular distribution of FIG. 10a is employed. The resultant integrated intensity distribution that exposes the photoresist is shown in FIG. 10b and the intensity variation across the central axis of this distribution is shown in FIG. 10c. The resulting pattern printed into photoresist is illustrated in FIG. 10d. The example again demonstrates the capability of the present invention for printing periodic patterns of features whose shapes are significantly different from those in the mask, and for printing ring shapes.

Figure 11A:
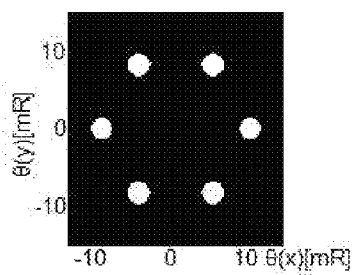
FIGS. 11a, 11b, 11c and 11d show respectively an angular distribution comprising six circular zones for illuminating, according to the present invention, a periodic pattern on a hexagonal grid, the intensity distribution in the resulting image, the intensity profile along an axis of said image, and the resulting pattern printed into photoresist.
Figure 11B:
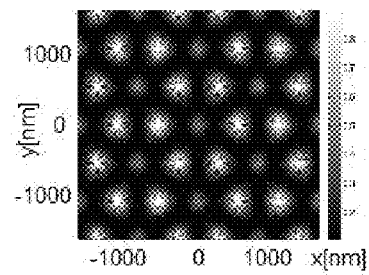
Figure 11C:
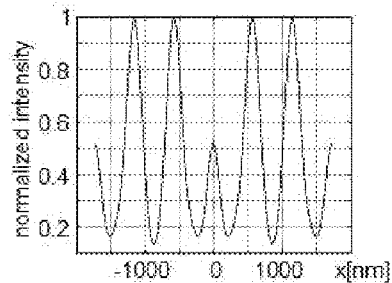
Figure 11D:
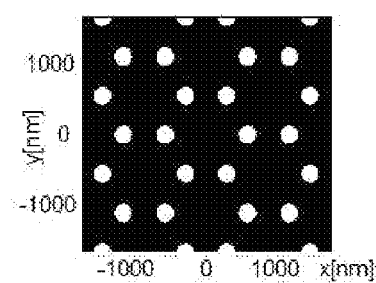

In another embodiment, the angular distribution of FIG. 11a is employed, which comprises six circular regions arranged at the vertices of a hexagon. The resultant integrated intensity distribution that exposes the photoresist is shown in FIG. 11b and the intensity variation across the central axis of this distribution is shown in FIG. 11c. The resulting pattern printed into photoresist is illustrated in FIG. 11d. This examples demonstrate the capability of the present invention for printing a honeycomb array of holes, and for printing such holes with nearest-neighbour distances that are substantially smaller than the nearest-neighbour distance of the holes in the mask.

Figure 12A:
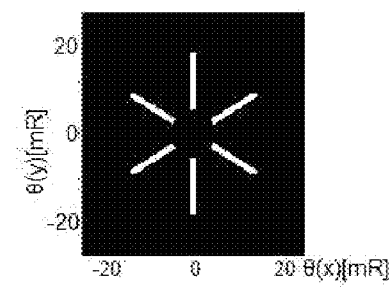
FIGS. 12a, 12b, 12c and 12d show respectively an angular distribution comprising six longer rectangular zones for illuminating, according to the present invention, a periodic pattern on a hexagonal grid, the intensity distribution in the resulting image, the intensity profile along an axis of said image, and the resulting pattern printed into photoresist.
Figure 12B:
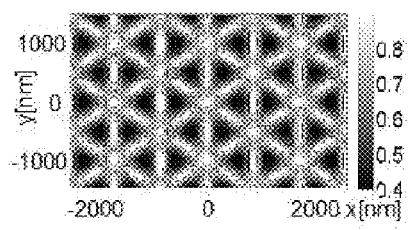
Figure 12C:
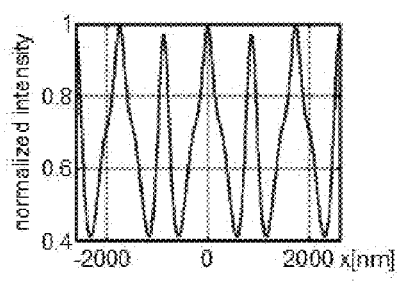
Figure 12D:
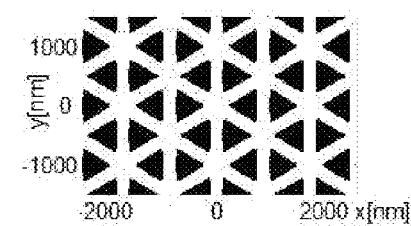

In another embodiment, the angular distribution of FIG. 12a is employed, which comprises 6 longer lines symmetrically arranged around a central point. The resultant integrated intensity distribution that exposes the photoresist is shown in FIG. 12b and the intensity variation across the central axis of this distribution is shown in FIG. 12c. The resulting pattern printed into photoresist is illustrated in FIG. 12d. This example demonstrates the capability of the present invention for printing a mesh, or grid, of high-resolution lines with an extended depth of focus.

Figure 13A:
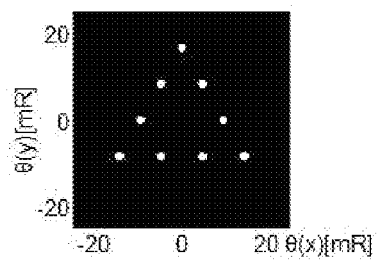
FIGS. 13a, 13b, 13c and 13d show respectively an angular distribution comprising nine circular zones for illuminating, according to the present invention, a periodic pattern on a hexagonal grid, the intensity distribution in the resulting image, the intensity profile along an axis of said image, and the resulting pattern printed into photoresist.
Figure 13B:
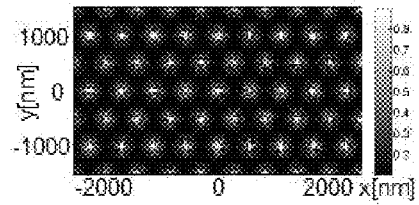
Figure 13C:
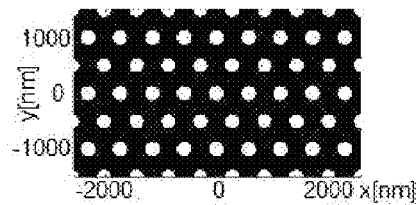
Figure 13D:
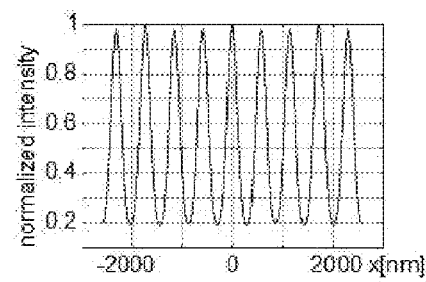

In another embodiment, the angular distribution of FIG. 13a is employed, which comprises a triangular array of nine circular holes The resultant integrated intensity distribution that exposes the photoresist is shown in FIG. 13b and the intensity variation across the central axis of this distribution is shown in FIG. 13c. The resulting pattern printed into photoresist is illustrated in FIG. 13d. This example demonstrates the capability of the present invention for printing a pattern that has the same symmetry as that in mask but with a substantially smaller period, or higher spatial-frequency, in this case by a factor of $\sqrt{3}$.

Figure 14A:
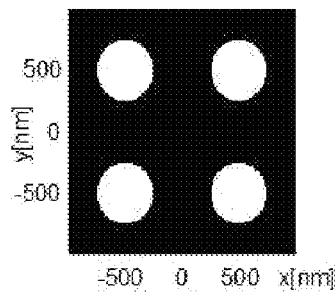
FIGS. 14a, 14b, 14c and 14d show respectively a section of a periodic pattern of holes on a square grid in a mask, the intensity distribution in the image generated by illuminating said pattern with a collimated beam according to the prior art, the intensity profile along an axis of said image, and the resulting pattern printed into photoresist.
Figure 14B:
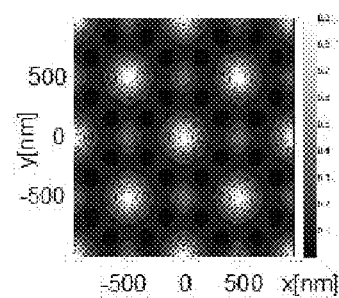
Figure 14C:
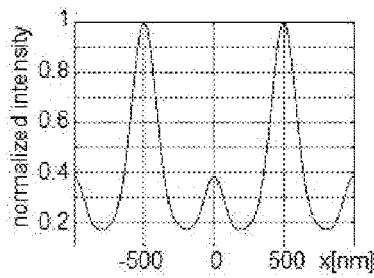
Figure 14D:
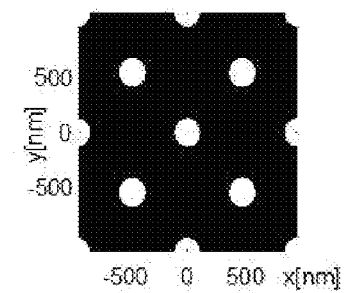

Another set of embodiments is now shown using instead a mask pattern comprising an array of holes on a square grid with 1 µm period, a section of which is shown in FIG. 14a. As previously, the holes have been etched into a 60 nm-thick layer of chrome on a fused silica substrate and the substrate and the area within the holes has been further etched to maximize the contrast of the image obtained using the ATL or DTL techniques according to the prior art. The integrated intensity distribution formed from this mask pattern by illuminating the mask by illuminating the mask with a single angle of incidence and using the ATL or DTL methods according to the prior art is shown in FIG. 14b, and the intensity variation across the central axis of this distribution is shown in FIG. 14c. The resulting pattern printed by the integrated intensity distribution into a layer of positive-tone photoresist is illustrated in FIG. 14d. As can be seen, in this case the printed pattern also comprises holes on a square grid array, but the axes of the array have been rotated by 45° with respect to those of the mask and the period of the array has been reduced by a factor of $\sqrt{2}$.

The results obtained by illuminating this pattern mask, using the exemplary apparatuses of FIGS. 2 and 3, with different angular distributions of illumination whilst exposing a photo-resist coated wafer so that the light of each angular component of illumination transmitted by the mask exposes the wafer according to the ATL or DTL techniques are now presented to further illustrate the versatility and improved imaging properties possible with the present invention in comparison with the prior art.

Figure 15A:
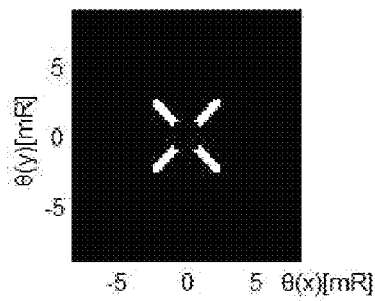
FIGS. 15a, 15b, 15c and 15d show respectively an angular distribution comprising four rectangular zones for illuminating, according to the present invention, a periodic pattern on a square grid, the intensity distribution in the resulting image, the intensity profile along an axis of said image, and the resulting pattern printed into photoresist.
Figure 15B:
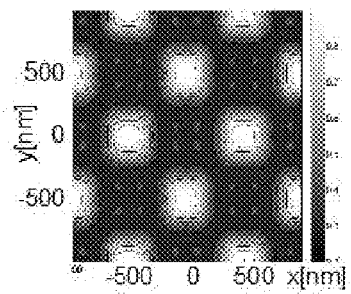
Figure 15C:
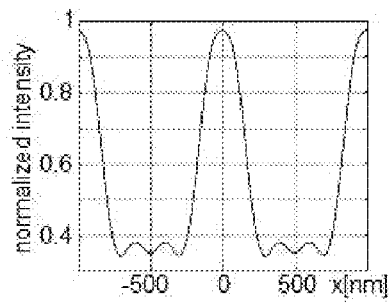
Figure 15D:
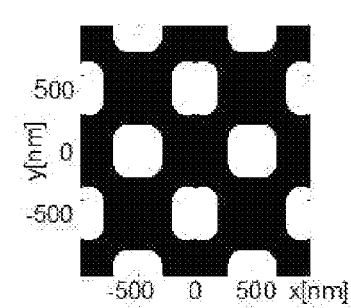

In one embodiment the angular distribution of FIG. 15a is employed, which is composed of four arms of a 45°-rotated cross. The resultant integrated intensity distribution that exposes the photoresist is shown in FIG. 15b and the intensity variation across an axis of this distribution is shown in FIG. 15c. The resulting pattern printed into photoresist is illustrated in FIG. 15d. This example demonstrates the capability of the present invention for printing an array of square shaped features.

Figure 16A:
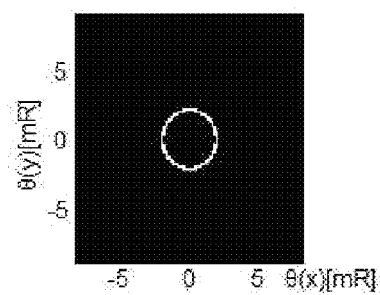
FIGS. 16a, 16b, 16c and 16d show respectively an annular angular distribution for illuminating, according to the present invention, a periodic pattern on a square grid, the intensity distribution in the resulting image, the intensity profile along an axis of said image, and the resulting pattern printed into photoresist.
Figure 16B:
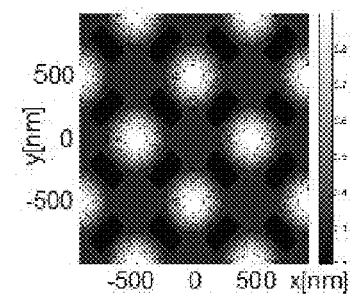
Figure 16C:
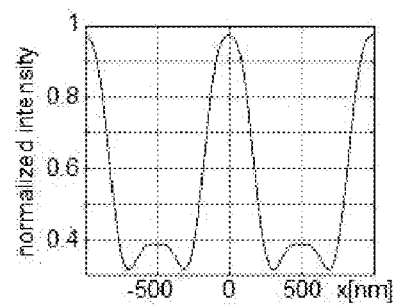
Figure 16D:
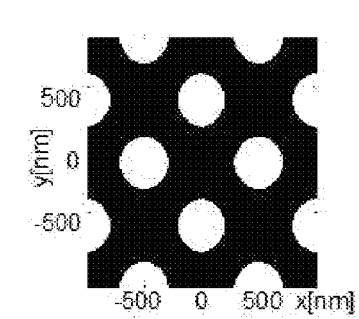

In another embodiment, the annular angular distribution of FIG. 16a is employed. The resultant integrated intensity distribution that exposes the photoresist is shown in FIG. 16b and the intensity variation across the central axis of this distribution is shown in FIG. 16c. The resulting pattern printed into photoresist is illustrated in FIG. 16d. The example demonstrates the capability of the present invention for printing arrays of holes whose diameter-to-period ratio is substantially larger than that achieved with the ATL or DTL techniques according to the prior art, and shows also that the various design parameters can be selected so that the gradient of the intensity profile at the edges of the features is high, as required for a high-yield production process.

Figure 17A:
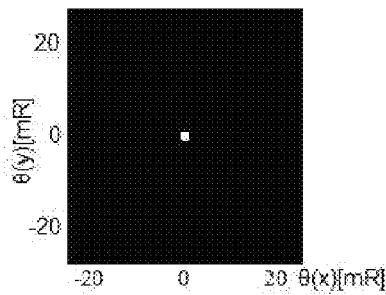
FIGS. 17a, 17b, 17c and 17d show respectively an angular distribution comprising a single square zone for illuminating, according to the present invention, a periodic pattern on a square grid, the intensity distribution in the resulting image, the intensity profile along an axis of said image, and the resulting pattern printed into photoresist.
Figure 17B:
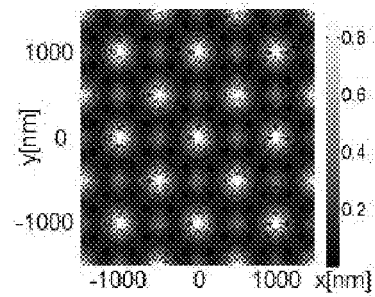
Figure 17C:
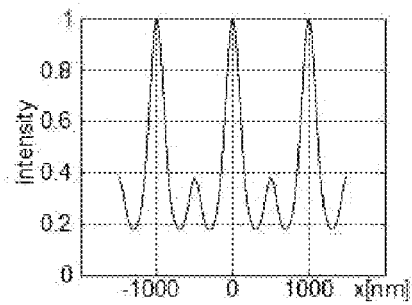
Figure 17D:
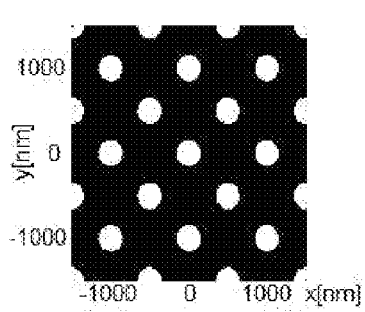

The next two sets of figures illustrate the improved utilization of illumination from a light source that is possible using the present invention. The angular distribution shown in FIG. 17a, comprising small square zone, essentially corresponds to a well collimated beam. FIGS. 17b, 17c and 17d show respectively the resulting integrated intensity distribution at the wafer, the intensity profile across the central axis of this distribution, and the pattern thereby printed into the photoresist. Using an arc source, however, only a very small fraction of the total light output can be used to produce such a well-collimated beam, that is, most of the light would be blocked by the chrome of the aperture mask concerned, which is a severe disadvantage for a production process. By, however, including additional holes in the aperture mask that correspond to the angular distribution of FIG. 18a, the intensity in the integrated distribution reaching the photoresist can be amplified. The holes in the angular distribution are arranged such that stationary images from each of the holes are aligned at the photoresist to produce substantially the same intensity distribution, as shown in FIG. 18b. The resultant intensity distribution along an axis is shown in FIG. 18c, demonstrating that the intensity of the image has been increased by a factor of 5, and lastly the pattern printed into photoresist by this angular distribution of illumination is shown in FIG. 18d.

In each of the above embodiments and generally using the present invention, the depth of focus of the imaged features is considerably larger than when printing the same pattern with a conventional lithographic technology (e.g. lens-based imaging system) operating at or near the same wavelength. The depth of focus of the patterns printed with the present invention is proportional to the period of the pattern and inversely proportional to the angular extent of the illumination.

Figure 18A:
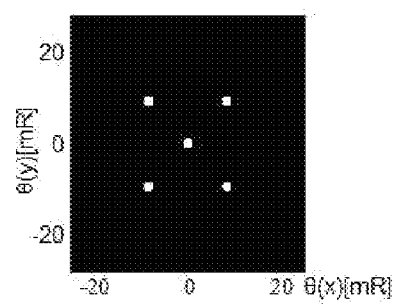
FIGS. 18a, 18b, 18c and 18d show respectively an angular distribution comprising five square zones for illuminating, according to the present invention, a periodic pattern on a square grid, the intensity distribution in the resulting image, the intensity profile along an axis of said image, and the resulting pattern printed into photoresist.
Figure 18B:
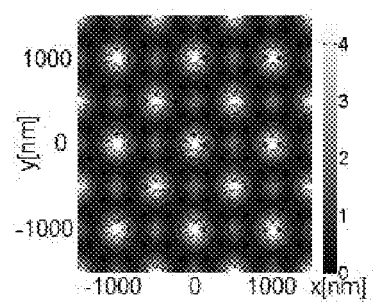
Figure 18C:
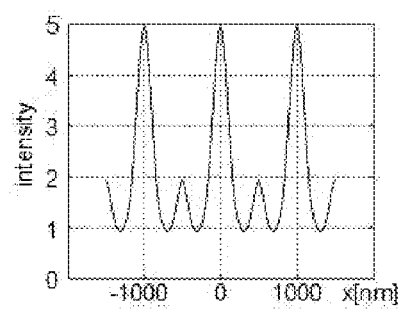
Figure 18D:
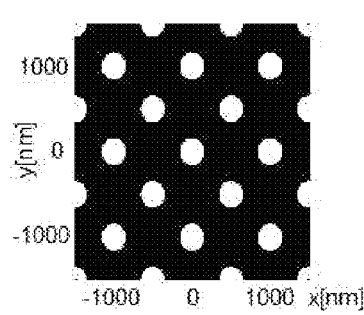
Figure 19A:
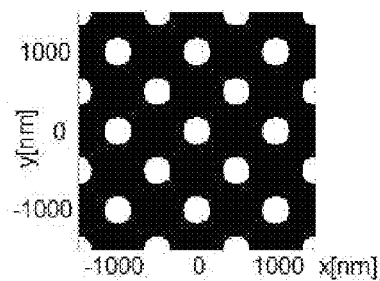
FIGS. 19a, 19b, 19c and 19d show respectively the intensity distribution in an image with a positive defocus, the intensity profile across this image, the intensity distribution in the image with a negative defocus, and the intensity profile across that image, when illuminating, according to the present invention, a periodic pattern on a square grid with an angular distribution comprising five square zones.
Figure 19B:
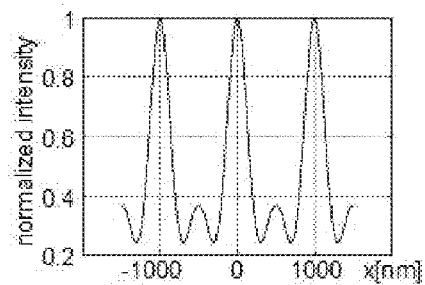
Figure 19C:
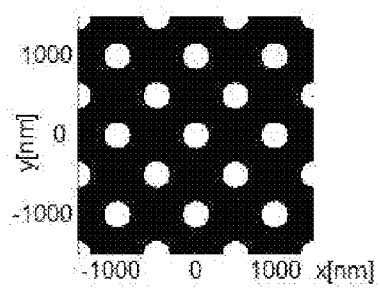
Figure 19D:
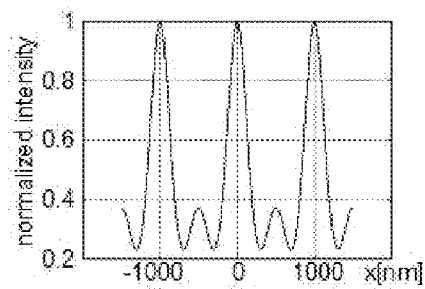
Figure 20:
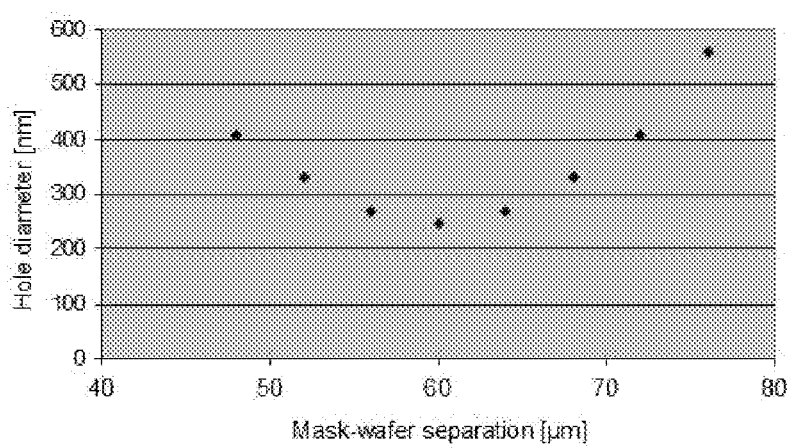
FIG. 20 shows the dependence of the diameter of the holes printed into photoresist on the separation between the substrate and mask when illuminating, using the present invention, a periodic pattern on a square grid with an angular distribution comprising five square zones.

To demonstrate the large depth of focus possible with this technique, the 0.25 µm-resolution image generated by the angular distribution of FIG. 18a and the resulting pattern printed into photoresist are calculated at different values of defocus. For defocus values of −8 µm and +8 µm the intensity profiles along the axis of the images are shown respectively in FIGS. 19a and 19c, and the patterns printed at these defocus distances into the photoresist are shown respectively in FIGS. 19b and 19d. The dependence of the diameters of the holes printed in photoresist on the defocus value is shown in FIG. 20, thus demonstrating the large depth of focus that can be obtained for high-resolution patterns using the present invention.

Since, as mentioned, the depth of focus depends on the angular extent of the illumination, even larger values of depth of focus may be obtained with substantially the same image quality by reducing the angular extent of the illumination and displacing the focal plane of the image further from the pattern mask.

A large depth of focus enables better printing uniformity and reproducibility, and a wider range of applications.

For printing a pattern with a higher spatial frequency than that in the mask using an angular distribution that comprises a plurality of substantially discrete angles (as illustrated by FIGS. 13a-d above), it is particularly advantageous that the angles of illumination are selected such that the main intensity peaks of the integrated image formed using the ATL or DTL techniques at the wafer surface by illumination at any one of the selected angles are aligned, or superposed, with the locations at the photoresist of the secondary peaks of the integrated images formed by the illumination at the other angles; or, alternatively, they should be aligned, or superposed with the locations of the secondary peaks and main peaks formed by the other angles of illumination. Superposing the integrated images in this way ensures that the resulting frequency-multiplied pattern has high contrast which enables it to be printed accurately and reliably into the photoresist, which is most desirable for a manufacturing process. If it is not possible to align the main peaks formed by one angle of illumination with the secondary peaks formed by other angles for obtaining the desired pattern because, for example, no secondary peaks exist, then a pattern with higher spatial-frequency may still be achieved but not necessarily with sufficiently high contrast.

This requirement is satisfied by the angular distribution of illumination illustrated in FIG. 13a. The angular separation of neighbouring holes in the distribution of FIG. 13a is ~9.6 mR and the holes are arranged in an equilateral triangle whose three sides are respectively parallel to the x-axis and inclined at ±30° with respect to the y axis. Since the separation of the mask and wafer employed in these embodiments using the first and second apparatuses is ~60 µm, the integrated images formed at the wafer using the ATL or DTL techniques by illuminating the mask with light from neighbouring holes in this angular distribution are therefore mutually offset by the product of the angular separation and the separation of the mask, that is, by ~0.58 µm; and, furthermore, in view of the triangular arrangement of the holes in the angular distribution of FIG. 3, the integrated images formed at the wafer by illumination from neighbouring holes in the distribution are mutually offset either parallel to the x-axis or in directions at ±30° to the y axis. From examination of the intensity distribution at the wafer formed using the ATL or DTL techniques by illuminating the hexagonal pattern in the mask with a single angle of incidence, which is illustrated in FIG. 6a, it can be determined that the secondary peaks of the distribution are also offset from the main peaks by ~0.58 µm in directions either parallel to the x-axis or at ±30° to the y axis, and therefore the particular angular distribution selected for illuminating the mask results in the alignment, or superposition, of the main peaks in the integrated intensity distribution formed at the wafer by one of the discrete angles in the distribution with the secondary and or main peaks formed by each of the other discrete angles. A high-contrast frequency-multiplied pattern is therefore assured, enabling an accurate and reliable photolithographic process.

Figure 21:
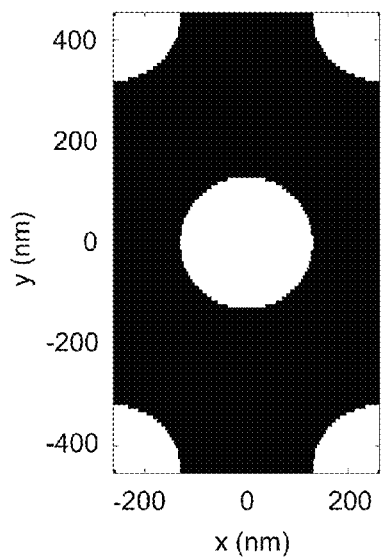
FIG. 21 shows a unit cell of a hexagonal array of holes in a mask pattern.

In another embodiment that further illustrates the advantage gained by satisfying this condition on the angular distribution for printing a frequency-multiplied pattern, a chrome mask is manufactured with a ~30 mm×30 mm pattern of holes on a hexagonal grid with a nearest-neighbour distance of 0.52 µm, as illustrated by the unit cell of the pattern shown in FIG. 21. The mask 96 is introduced into the exposure apparatus illustrated in FIG. 22 so that the x- and y-axes of the mask pattern are aligned parallel with the respective x- and y-axes of the exposure system. The illumination source of the exposure system is an argon-ion laser 80 that emits a ~2 mm-diameter beam of collimated light 81 at wavelength of 363.8 nm, with a power up to 1 W, and in TEM mode, i.e. with Gaussian intensity profile. An electronically controlled shutter 82 is located in the path of the output beam for enabling the exposure time of the mask 96 to be accurately and reproducibly controlled. When the shutter 82 is open, the beam passes through a quarter-wave plate 83 for converting the plane polarized beam from the laser into one that is circularly polarized, and is then incident on beam-conditioning optics 84. These include standard beam-expansion optical elements for producing a >50 mm diameter collimated beam and also a beam-shaping elements for converting the Gaussian intensity profile of incident beam into a substantially top-hat distribution. The latter may be achieved using a refractive beam-shaper of the type supplied by the company Molecular Technology GmbH, in particular one of their Pi-shaper product range. The large-area and substantially uniform beam of collimated light from the beam-conditioning system 84 is reflected by a mirror 86 towards a fused-silica wedge plate 88. The two faces of the wedge plate 88 have been machined and polished to good flatness and so that the angle between them is 0.5°. The faces of the wedge plate 88 are preferably coated with anti-reflection coatings. The incident beam is refracted as it passes through the wedge plate 88 such that the transmitted beam is angularly deflected with respect to the incident beam by ~0.24°. The wedge plate 88 is mounted to a mechanical system (not indicated in FIG. 22) that approximately centres the plate 88 on the system z-axis and enables it to be rotated about that axis. The rotation may be performed either manually or preferably by means of a motorised stage via the apparatus's control system. The orientation of the mirror 86 is adjusted so that in the absence of the wedge plate 88 the beam illuminates the mask 96 at substantially normal incidence. A wafer 97 coated with standard i-line sensitive photoresist is held by a vacuum chuck 98 below the mask 96 which, as in the apparatus of FIG. 3, is mounted to a stage system 99 that includes piezo-electric transducer for enabling the wafer 97 to be arranged parallel and at a particular distance from the mask 96. Using the same procedures as described in the earlier embodiments the separation of the photoresist-coated wafer 97 and mask 96 is adjusted to ~34 µm.

Figure 23:
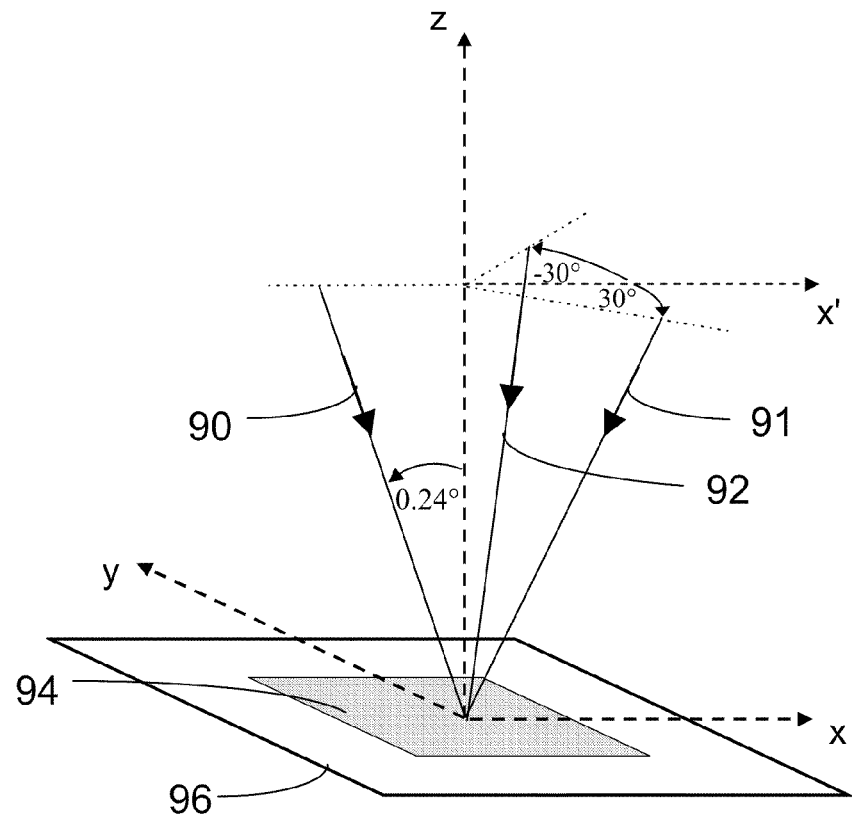
FIG. 23 illustrates the angles employed for exposing the mask pattern of FIG. 21 using the apparatus of FIG. 22.

The exposure process is performed by, firstly, rotating the wedge plate 88 so that the beam that would be incident on the mask 96 with the shutter 82 open is angularly deflected in the xz plane by −0.24°, as illustrated by ray 90 in FIG. 23. Following this, the shutter 82 is opened so that the beam illuminates the mask 96 for a first sub-exposure. During exposure the wafer 97 is longitudinally displaced with respect to the mask 96 using the piezo-electric transducers in the stage system 99. The speed of displacement is varied during the displacement according to the DTL technique disclosed in U.S. application Ser. No. 13/035,012 such that the exposure dose per incremental displacement of the photoresist-coated wafer 97 varies according to a substantially Gaussian profile whose FWHM is substantially the Talbot distance of the particular pattern 94 in the mask 96 for the wavelength concerned, that is, ~1.1 µm. The exposure time and laser power are selected so that the integrated exposure dose delivered to the photoresist corresponds substantially to one third of that needed for forming the desired pattern. The parameter values required may be estimated for the initial set of sub-exposures and thereafter optimized by experimentation using standard techniques for evaluating the printed patterns. Following the first sub-exposure, the shutter 82 is closed, the separation of the mask 96 and wafer 97 is re-adjusted to ~34 µm, and the wedge plate 88 is rotated by 120° so that the beam, if the shutter 82 were open, would be angularly deflected by 0.24° in a plane at +30° to the x axis, as illustrated by ray 91 in FIG. 23. Following this, the shutter 82 is opened so that the beam illuminates the mask 96 for a second exposure during which the wafer 97 is longitudinally displaced with respect to the mask 96 in the same manner as for the first exposure, and so that the photoresist receives the same integrated exposure dose as in the first sub-exposure. Following this second sub-exposure, the shutter 82 is again closed, the separation of the mask 96 and wafer 97 is re-adjusted to ~34 µm, and the wedge plate 88 is rotated by a further 120° so that the beam, if the shutter 82 were open, would be angularly deflected by 0.24° in a plane at −30° to the x axis as illustrated by ray 92 in FIG. 23. Following this, the shutter 82 is opened and the wafer 97 displaced as before whilst exposing the photoresist to the same integrated exposure dose. The exposed wafer 97 is developed and evaluated.

Figures 24, 25:
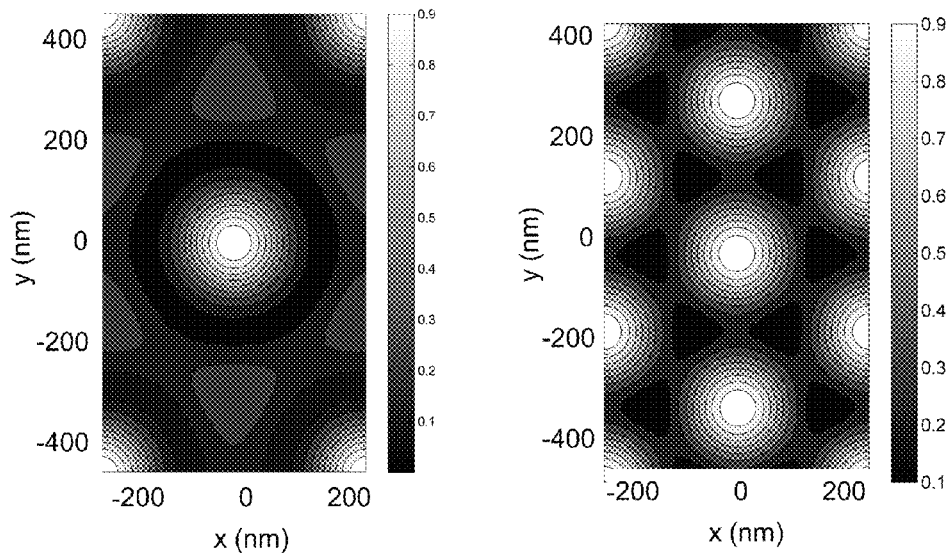
FIG. 24 shows the integrated intensity distribution formed at the photoresist using the DTL or ATL technique when illuminating the mask pattern of FIG. 21 at a single angle of incidence.
FIG. 25 shows the integrated intensity distribution formed at the photoresist using the DTL or ATL technique when illuminating the mask pattern of FIG. 21 at three angles of incidence selected so that the main peaks formed by each angle are aligned with the secondary peaks formed by the other angles.

If the pattern 94 in the mask 96 were exposed using the ATL or DTL techniques and a single angle of illumination, the resulting integrated intensity distribution illuminating the photoresist would be a hexagonal pattern of intensity peaks with the same nearest-neighbour distance. This is illustrated in FIG. 24 which shows an intensity-contour map in a unit cell unit of the resulting periodic distribution that has been determined by computer simulation based on scalar diffraction theory. From these results it can be seen that weaker, secondary peaks are present between the main peaks, and furthermore that the secondary peaks and main peaks together are arranged on a hexagonal grid with a nearest-neighbour distance that is a factor of $\sqrt{3}$ smaller than that in the mask.

The angular deflections introduced into the beam by the wedge plate 88 during the three sub-exposures causes the integrated intensity distribution exposing the photoresist to be laterally displaced (with respect to the pattern that would be printed without the wedge plate 88) by a distance corresponding to the product of the angular deflection of the beam and the separation of the mask 96 and wafer 97, that is, by 0.14 µm. The magnitude of the angular deflection and the separation of the mask 96 and wafer 97 have been selected so that the lateral displacement of the intensity distribution corresponds to one third of the nearest-neighbour distance of the main intensity peaks. The orientations of the wedge plate 88 employed for the three sub-exposures have been selected so that the integrated intensity distribution at the photoresist is displaced in the +x direction by the first sub-exposure, in a direction at +30° to the x-axis by the second sub-exposure, and in a direction at −30° to the x-axis by the third sub-exposure. From consideration of FIGS. 23 and 24, it can therefore be appreciated that with these selections of the beam-deflection parameters the locations of the main intensity peaks at the photoresist produced by each sub-exposure are aligned with the secondary peaks formed by the other exposures; and therefore, since the exposure doses delivered by the three sub-exposures are the same, the resulting pattern printed into the photoresist is a hexagonal array of equal-intensity peaks with a nearest-neighbour distance that is $\sqrt{3}$ smaller than that in the mask, i.e. 0.3 µm. FIG. 25 shows an intensity-contour map of a unit cell of the resulting periodic distribution illuminating the photoresist as determined by computer simulation based on scalar theory. Since the minima of the integrated intensity distributions formed by the different sub-exposures are also necessarily aligned at the photoresist, the contrast of the superposed intensity distributions is high, as is evident from FIG. 25.

Since the illumination beam is slightly offset from normal incidence for each exposure whereas the mask is displaced longitudinally with to the mask 96 (i.e. a direction normal to the mask) during each sub-exposure, a slight degree of ellipticity, or elongation, is introduced into the cross-sectional shapes of the intensity peaks in the integrated intensity distribution formed by each sub-exposure. The magnitude of this distortion may be estimated as the product of the angular offset of the illumination beam (measured in radians) and the FWHM of the profile describing the dependence of the exposure dose per incremental displacement of the wafer on displacement. For the embodiment under consideration, in which the offset is 0.24° and the FWHM is 1.1 µm, the estimated distortion is ~5 nm, which is negligible in relation to the diameter of the intensity peaks. Moreover, the directions of distortion introduced by the three sub-exposures are angularly separated by 120°, which substantially eliminates any net asymmetry.

Figure 22:
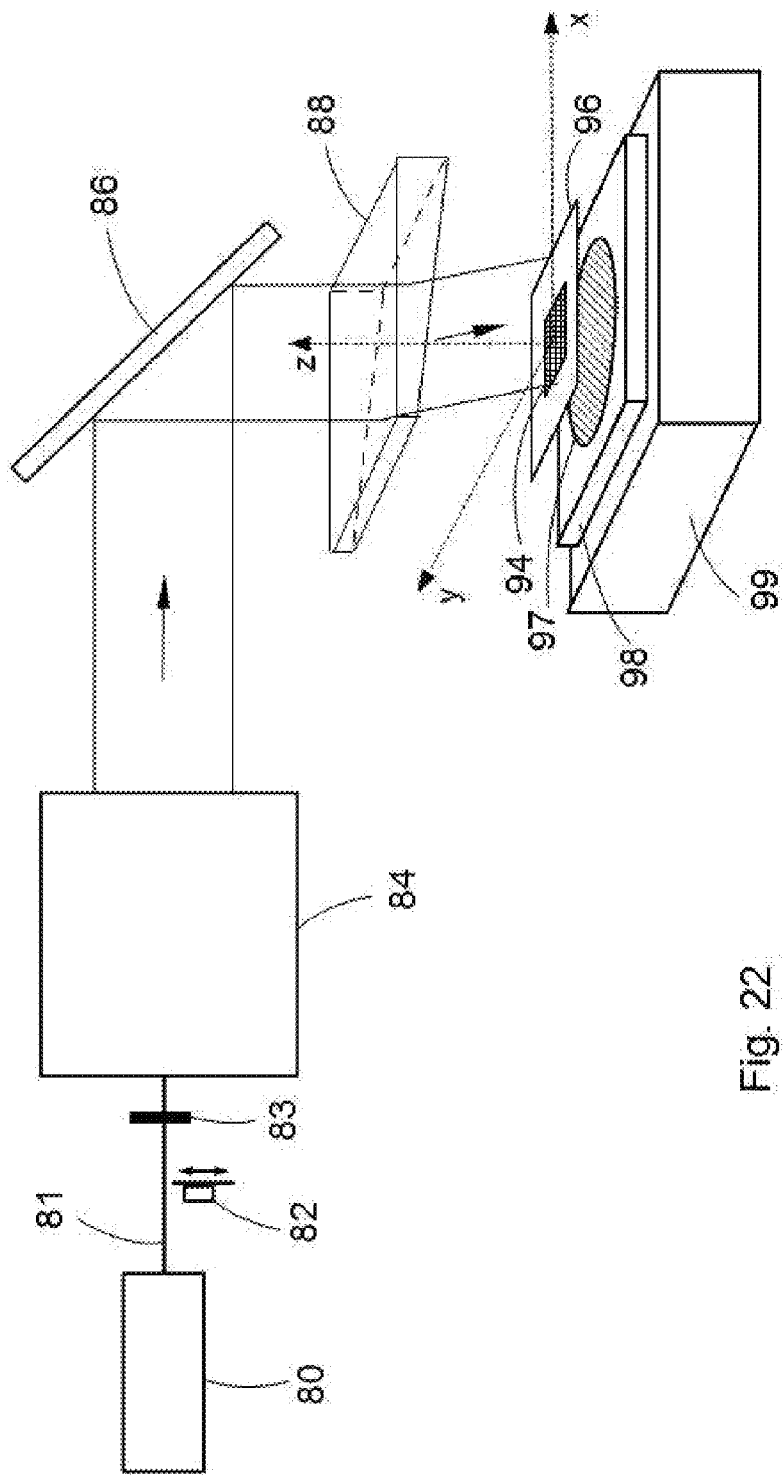
FIG. 22 illustrates a further embodiment of the invention for illuminating a mask at a plurality of angles of incidence during the exposure, which employs a single wedge plate.
Figure 26:
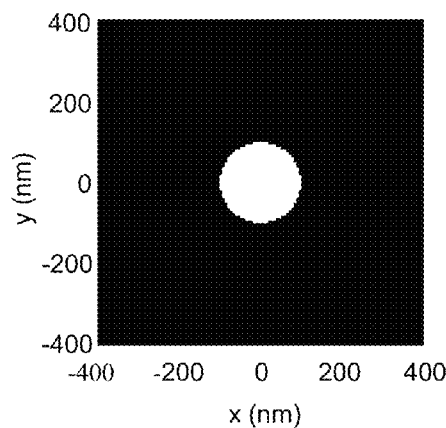
FIG. 26 shows a unit cell of a square array of holes in a mask pattern.

In another embodiment that further illustrates the advantages for printing a frequency-multiplied pattern that are obtained by arranging that the main intensity peaks formed at the photoresist by each angle of illumination are aligned with the locations of the secondary peaks produced by the other angles of illumination, a chrome mask bearing a pattern of holes on a square grid with a period of 0.8 µm (see unit cell of periodic pattern shown in FIG. 26) is introduced instead into the exposure apparatus of FIG. 22. The x- and y-axes of the mask pattern are aligned parallel with the x- and y-axis respectively of the exposure system. The separation of the mask and photoresist-coated wafer is adjusted to ~48 µm. The exposure procedure follows a similar sequence to that above for the hexagonal pattern except that two sub-exposures are employed instead of three. For the first sub-exposure the wedge plate is oriented such that the beam illuminating the mask is deflected by +0.24° in the xz plane, and for the second sub-exposure the wedge plate is rotated by 180° so that the beam is deflected by 0.24° in the opposite direction. During each sub-exposure the wafer is longitudinally displaced with respect to the mask and the speed of displacement is varied according to the DTL technique disclosed in U.S. application Ser. No. 13/035,012. Specifically, the speed is varied so that the dependence of exposure dose per incremental displacement on the displacement approximates to a Gaussian profile whose FWHM corresponds to the Talbot distance for the particular pattern and wavelengths concerned, that is, ~1.5 µm.

Figures 27, 28:
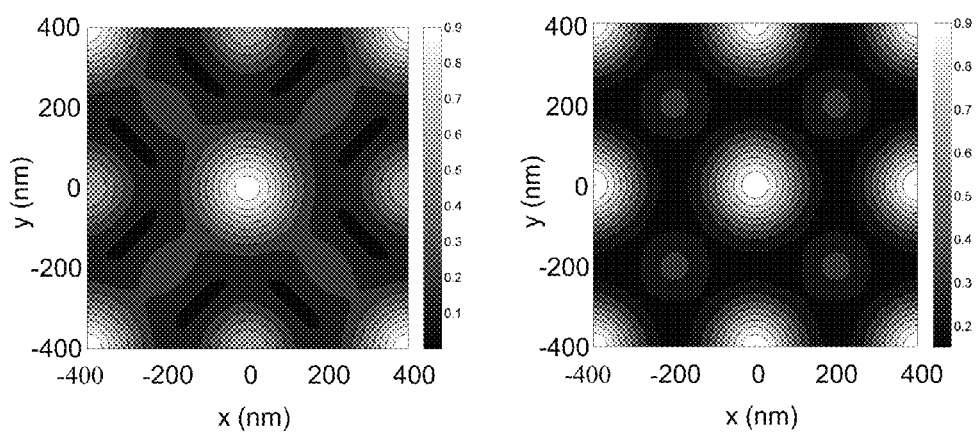
FIG. 27 shows the integrated intensity distribution formed at the photoresist using the DTL or ATL technique when illuminating the mask pattern of FIG. 26 at a single angle of incidence.
FIG. 28 shows the integrated intensity distribution formed at the photoresist using the DTL or ATL technique when illuminating the mask pattern of FIG. 26 at three angles of incidence selected so that the main peaks in the integrated intensity distribution at the photoresist formed by each angle are aligned with the secondary peaks in the distributions formed by the other angles.
Figure 29:
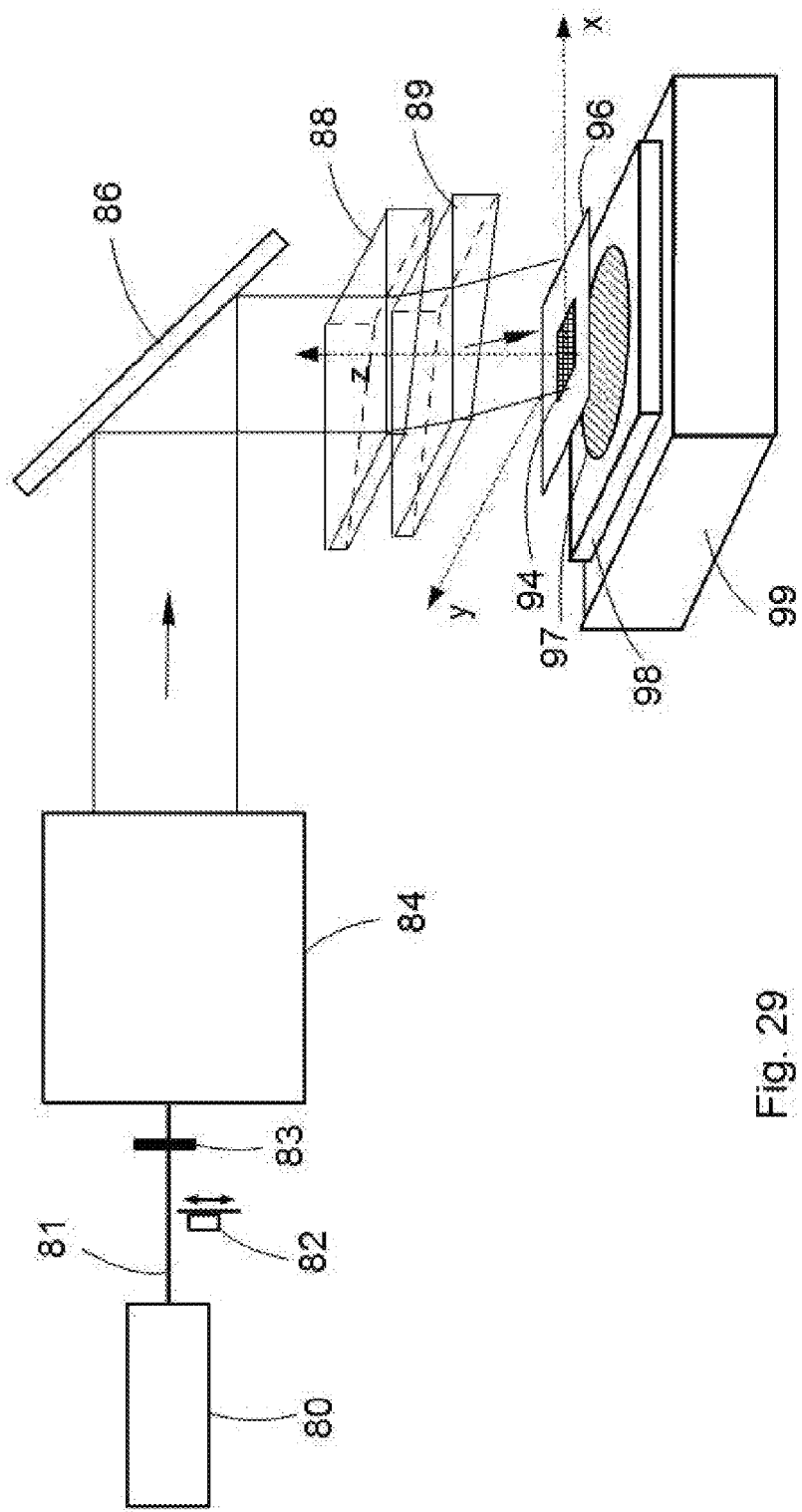
FIG. 29 illustrates a further embodiment of the invention for illuminating a mask at a plurality of angles of incidence during the exposure, which employs a pair of wedge plates.

If the square-grid pattern in the mask were exposed using the ATL or DTL techniques and a single angle of illumination, then the integrated intensity distribution produced at the photoresist layer would be a square-grid pattern with a period $\sqrt{2}$ smaller than that in the mask and with axes rotated by 45° with respect to those of the mask. FIG. 27 shows an intensity contour map of a unit cell of the resulting periodic distribution illuminating the photoresist determined by computer simulation based on scalar theory. From these results, it can be seen that weaker, secondary peaks are located midway between the main peaks of the frequency-multiplied pattern, that is, at distances of 0.4 µm from the main peaks. By performing instead two sub-exposures of the mask pattern according to the teaching of the present invention, as described above, the intensity distribution of FIG. 27 is laterally displaced by the product of the angular deflection and the separation of the mask and wafer, so that in the first sub-exposure it is displaced by 0.2 µm in the +x-direction, and in the second sub-exposure it is displaced 0.2 µm in the −x-direction. It can therefore be appreciated from consideration of FIG. 27 that this results in the main peaks in the integrated intensity distribution of each sub-exposure being aligned with the locations at the photoresist of the secondary peaks formed by the other exposure. Since the exposure doses delivered by the two sub-exposures are the same, the resultant pattern printed into the photoresist is a square array of equal-intensity peaks whose period is half that of the pattern in the mask, that is, 0.4 µm, and whose axes are parallel to those in the mask. FIG. 28 shows an intensity contour map of a unit cell of the resulting periodic distribution illuminating the photoresist as determined by computer simulation based on scalar theory. Since the minima of the integrated intensity distributions produced at the photoresist by each sub-exposure are aligned with the minima produced by the other sub-exposure, the contrast of the superposed pattern is high, as is also evident from FIG. 28.

This procedure for obtaining a high contrast of frequency-multiplied image requires the presence of secondary peaks between the main peaks in the integrated intensity distribution formed at the photoresist when illuminating with a single angle of incidence. Whereas in the case of hexagonal arrays of features it is determined, from computer simulation, that secondary peaks are generally present between the main peaks as the period of the pattern is reduced to such a value that 1st diffracted orders from the periodic pattern cease to exist for the particular illumination wavelength concerned; in the case of square arrays of features, it is determined that the secondary peaks disappear between the main peaks when the period is reduced to such a value that the diagonally diffracted 1st orders, i.e. the ($\pm 1$, $\pm 1$) orders, are too weak or completely extinguished. The latter occurs when the period, $p=\sqrt{2}\lambda$. So, for example, if the illumination wavelength is 364 nm, no secondary peaks are formed in the integrated intensity distribution for $p \leq 515$ nm. However, since the intensity of the diagonally-diffracted orders falls slowly to 0 as the period is reduced to this limit, even for larger periods the intensity of the diagonal may be too weak for the generating significant secondary peaks and for enabling a high contrast of frequency multiplied pattern. The practical limit for the smallest period of frequency-multiplied pattern that can be usefully obtained using a particular illumination wavelength and photoresist process is preferably determined by computer simulation based on more-accurate electromagnetic vector theory and/or experimental investigation.

A limitation of the embodiments above using a wedge plate for changing the angle of incidence of the illumination beam between different sub-exposures of the mask, is that the deflection angle introduced by the wedge plate 88 is fixed because it is determined by the internal angle between its two faces. So, if the period of the pattern in the mask is changed and the same frequency-multiplication of the pattern is required, then it would be necessary to change the separation between the mask and wafer in order that the main peaks in the integrated intensity distribution of one exposure are aligned with secondary peaks formed by the other exposures. Such a change in separation may be undesirable because, for example, the separation may become so small that it introduces unacceptable risk of contact and associated damage to the mask; or, conversely, it may become too large and unacceptably degrade the quality of the edges of the printed pattern (at the edges of the pattern, there is imperfect overlap between the 0th and higher diffraction orders at the photosensitive layer, and also Fresnel diffraction effects, both of which locally degrade the quality of the printed pattern and become worse with increasing separation). For these reasons, it is advantageous that two wedge plates are instead employed, the two being inserted in series in the beam illuminating the mask, as illustrated in FIG. 24. With this embodiment, it is additionally possible to adjust the (polar) deflection angle of the beam transmitted by the two wedges 88, 89 with respect to the incident beam, and so enables it to be to be optimized with respect to the period of the pattern in the mask and to the desired separation of the mask and wafer. In the case that the internal wedge angle of two plates 88, 89 is the same such that both introduce the same angular deflection, $\omega$, of the transmitted beam, the maximum deflection angle that the pair of plates 88, 89 can introduce is $2\omega$, which occurs when the orientation of the two plates 88, 89 in the incident beam is the same (this arrangement corresponds to that depicted in FIG. 24); whereas the minimum deflection angle is 0°, which occurs when one the plates 88, 89 illustrated in FIG. 24 is rotated by 180° about the z-axis such that the orientations of the two wedges 88, 89 are in opposite directions. By adjusting the relative orientations of the plates 88, 89 between these two extremes, any (polar) deflection angle of the transmitted beam between 0° and $2\omega$ may be obtained. After fixing the relative orientations of the two plates 88, 89, the pair of plates 88, 89 may then be rotated together in the incident beam in order to obtain the required azimuthal angle of incidence of the beam on the mask for each of the sub-exposures, in the same manner as illustrated for the single wedge in FIGS. 22 and 23. This arrangement of a pair of wedges 88, 89 in the beam illuminating the mask also enables the polar angle of incidence of the illumination beam at the mask to be changed between sub-exposures, which can be advantageous for some embodiments. In other variants, the internal angles of the two wedge plates may be different, or alternatively three or more wedge plates may be introduced in the beam illuminating the mask.

In all the above examples, the angular distributions are binary, that is, the relative intensity at a particular angle is either 0 or 1. The chrome-on-quartz angular distribution mask 16 employed in the first set of exemplary embodiments is therefore suitable for producing such a distribution because its transmission is also binary: 0 where there is chrome and 1 in the open spaces (neglecting small reflection losses). This, however, is not a necessary condition or restriction of the present invention. In the above and other embodiments, the intensity at each angle may alternatively be quantized to multiple discrete levels or, more generally still, to vary in a substantially analogue way. Such angular distributions may be produced using, for example, gray-scale masks as are manufactured by Canyon Materials Inc., in which the transmission of the mask features can be varied in a gradual way between 0 and 1.

The smallest feature size that may be printed using the present invention may be significantly reduced by introducing a thin layer of a suitable liquid in the gap between the mask and substrate. For example, in the apparatus shown in FIG. 2, by including water between the mask 23 and wafer 24, the limit of imaging resolution of the system may be enhanced by nearly 40%. This arises because of the higher refractive index of water compared to air. It also enlarges the depth of focus of the printed pattern. Thus, in other embodiments of the invention, a suitable fluid, like water, which transmits the exposure wavelength with low absorption and is compatible with the photosensitive layer on the substrate surface, may be included between the mask and substrate for this purpose.

In another embodiment of the invention, angular distribution masks as described in the first embodiment for generating the required angular distribution of illumination may instead be employed with a laser source, and the exposures performed with a varying separation between the wafer and pattern mask.

In another embodiment of the invention, the optical scheme using an angular displacement of a mirror as described in the first embodiment for generating the required angular distribution of illumination may instead be employed with a light source with a relatively broad spectral bandwidth, and the exposures performed using a static separation between the wafer and pattern mask.

In other embodiments of the invention, the output wavelengths of the illumination source can be anywhere in a very broad range, for example, in the range 100-1000 nm.

While the embodiments described above may be considered as preferred embodiments of the invention, it should, of course, be understood that various modifications and changes in form or detail could readily be made without departing from the spirit of the invention. It is therefore intended that the invention should not be limited to the exact forms described and illustrated, but should be constructed to cover all modifications that may fall within the scope of the appended claims.

The invention claimed is:

1. A lithographic method is provided for printing a desired periodic or quasi-periodic pattern of features into a photosensitive layer, which method includes:
   a) providing a mask bearing a periodic or quasi-periodic mask pattern of features;
   b) providing a substrate bearing the photosensitive layer;
   c) arranging the substrate parallel to and with a separation from the mask;
   d) generating light with a central wavelength and a spectral bandwidth;
   e) illuminating each point of said mask pattern with said light at a plurality of angles of incidence to deliver a selected angular distribution of illumination energy density such that the light of each wavelength at each angle of incidence transmitted by the mask forms a range of lateral intensity distributions between Talbot planes, and one of maintaining and changing the separation during the illumination such that the light at each angle of incidence exposes the photosensitive layer to an intensity distribution comprising main and secondary peaks formed from an integration of substantially the entire range of lateral intensity distributions, the superposition of which over the plurality of angles prints the desired pattern;
   wherein the plurality of angles and mask pattern are selected in conjunction with the separation so that the main peaks formed at the photosensitive layer by light at any one of the angles of incidence are aligned with the main or secondary peaks formed by light at any of the other angles of incidence.

2. The lithographic method according to claim 1 wherein the light has a significant spectral bandwidth and the separation is selected in relation to the bandwidth so that the light at each angle of incidence exposes the photosensitive layer to substantially the entire range of lateral intensity distributions, and this separation is maintained during the illumination.

3. The lithographic method according to claim 1, wherein the light is substantially monochromatic and the separation is changed during the illumination by at least the distance between Talbot planes so that the light at each angle of incidence exposes the photosensitive layer to substantially the entire range of lateral intensity distributions.

4. The lithographic method according to claim 1, wherein the mask is illuminated at the different angles simultaneously to deliver the selected angular distribution of exposure energy density.

5. The lithographic method according to claim 1, wherein the mask is illuminated at the different angles sequentially to deliver the selected angular distribution of exposure energy density.

6. The lithographic method according to claim 1, wherein the selected angular distribution comprises a continuous variation of illumination energy density over the different angles.

7. The lithographic method according to claim 1, wherein the different angles of incidence that deliver the angular distribution of illumination to the mask lie in a single plane of incidence or have angular components in orthogonal planes of incidence.

8. The lithographic method according to claim 1, wherein the angular distribution of exposure energy is selected by computer simulation of the pattern printed into the photosensitive layer by illuminating the mask pattern with the selected angular distribution of exposure energy density whilst one of maintaining and changing the separation during the illumination.

9. The lithographic method according to claim 1, wherein the angular distribution and mask pattern are selected and optimized using at least one of computer simulation and experimental evaluation of the printed pattern.

10. A lithographic apparatus is provided for printing a desired periodic or quasi-periodic pattern of features into a photosensitive layer, which apparatus includes:
   a) a mask bearing a periodic or quasi-periodic mask pattern of features;
   b) substrate bearing the photosensitive layer;
   c) a means for arranging the substrate parallel to and with a separation from the mask;
   d) a light generating means for providing light with a central wavelength and a spectral bandwidth;
   e) a means for illuminating each point of said mask pattern with said light at plurality of angles of incidence to deliver a selected angular distribution of exposure energy density such that the light of each wavelength at each angle of incidence transmitted by the mask forms a range of lateral intensity distributions between Talbot planes, wherein said means includes at least one transparent wedge plate for angularly deflecting the light transmitted by the plate and a means for rotating the plate so that the angle of incidence of the light at the mask is rotated about an axis orthogonal thereto;
   f) a means for one of maintaining and changing the separation during the illumination such that the light at each angle of incidence exposes the photosensitive layer to substantially the entire range of lateral intensity distributions between Talbot planes.

11. The lithographic apparatus according to claim 10, wherein the light generating means is a discharge lamp or a light emitting diode that emits light with a significant spectral bandwidth.

12. The lithographic apparatus according to claim 10, wherein the light generating means is a laser that emits light with a narrow spectral bandwidth.

13. The lithographic apparatus according to claim 10, wherein the illumination means includes a binary mask or a gray-scale mask.

* * * * *